(12) United States Patent
Asakawa et al.

(10) Patent No.: US 8,575,587 B2
(45) Date of Patent: Nov. 5, 2013

(54) STORAGE DEVICE AND METHOD OF MANUFACTURING THE SAME

(75) Inventors: Koji Asakawa, Kanagawa (JP); Shigeki Hattori, Kanagawa (JP); Hideyuki Nishizawa, Tokyo (JP); Satoshi Mikoshiba, Kanagawa (JP); Reika Ichihara, Kanagawa (JP); Masaya Terai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/236,793

(22) Filed: Sep. 20, 2011

(65) Prior Publication Data

US 2012/0228576 A1 Sep. 13, 2012

(30) Foreign Application Priority Data

Mar. 7, 2011 (JP) ................................ 2011-049184

(51) Int. Cl.
*H01L 47/00* (2006.01)
*H01L 29/06* (2006.01)

(52) U.S. Cl.
USPC ........... 257/4; 257/5; 257/2; 257/40; 438/382

(58) Field of Classification Search
USPC .................... 257/1–8, E47.001, E21.007, 40; 438/382, 900; 635/100; 338/13
See application file for complete search history.

(56) References Cited

U.S. PATENT DOCUMENTS

| 6,565,763 | B1 | 5/2003 | Asakawa et al. |
| 6,730,930 | B2 | 5/2004 | Hofmann et al. |
| 6,746,825 | B2 | 6/2004 | Nealey et al. |
| 6,756,605 | B1 * | 6/2004 | Reed et al. ...................... 257/40 |
| 2003/0001490 | A1 * | 1/2003 | Yamamoto et al. ............ 313/495 |
| 2003/0049895 | A1 * | 3/2003 | Cerofolini et al. ............. 438/197 |
| 2003/0082444 | A1 * | 5/2003 | Kuhr et al. ..................... 429/149 |
| 2003/0168675 | A1 | 9/2003 | Hofmann et al. |
| 2003/0176034 | A1 * | 9/2003 | Jackson et al. ................. 438/237 |

(Continued)

FOREIGN PATENT DOCUMENTS

| JP | 2004-506333 | 2/2004 |
| JP | 2006-526898 | 11/2006 |

(Continued)

OTHER PUBLICATIONS

Reed et al. ("Molecular random access memory cell", Appl. Phys. Lett. 78, 3735 (2001)).*
U.S. Appl. No. 13/750,007, filed Jan. 25, 2013.
Office Action (with English translation) mailed on Jun. 25, 2013, in counterpart Japanese Appln No. 2011-049184 (6 pages).

*Primary Examiner* — Asok K Sarkar
*Assistant Examiner* — Dmitriy Yemelyanov
(74) *Attorney, Agent, or Firm* — Oblon, Spivak, McClelland, Maier & Neustadt, L.L.P.

(57) ABSTRACT

A storage device includes: a plurality of first electrode wirings; a plurality of second electrode wirings which cross the first electrode wirings; a via plug which is formed between the second electrode wiring and the two adjacent first electrode wirings, and in which a maximum diameter of a bottom surface opposing the first electrode wirings in a direction vertical to a direction in which the first electrode wirings stretch is smaller than a length corresponding to a pitch of the first electrode wiring plus a width of the first electrode wirings; a first storage element which is formed between the via plug and one of the two first electrode wirings; and a second storage element which is formed between the via plug and the other one of the two first electrode wirings.

19 Claims, 18 Drawing Sheets

(56) References Cited

U.S. PATENT DOCUMENTS

| | | | |
|---|---|---|---|
| 2004/0219731 A1* | 11/2004 | Hartwich et al. | 438/200 |
| 2006/0231827 A1* | 10/2006 | Hanato et al. | 257/40 |
| 2007/0246766 A1* | 10/2007 | Liu | 257/314 |
| 2008/0123397 A1* | 5/2008 | Liu | 365/163 |
| 2009/0196095 A1* | 8/2009 | Liu | 365/163 |
| 2009/0267044 A1* | 10/2009 | Chang | 257/3 |

FOREIGN PATENT DOCUMENTS

| | | |
|---|---|---|
| JP | 2006-332630 | 12/2006 |
| JP | 3940546 | 4/2007 |
| WO | WO 2012/014700 A1 | 2/2012 |

* cited by examiner

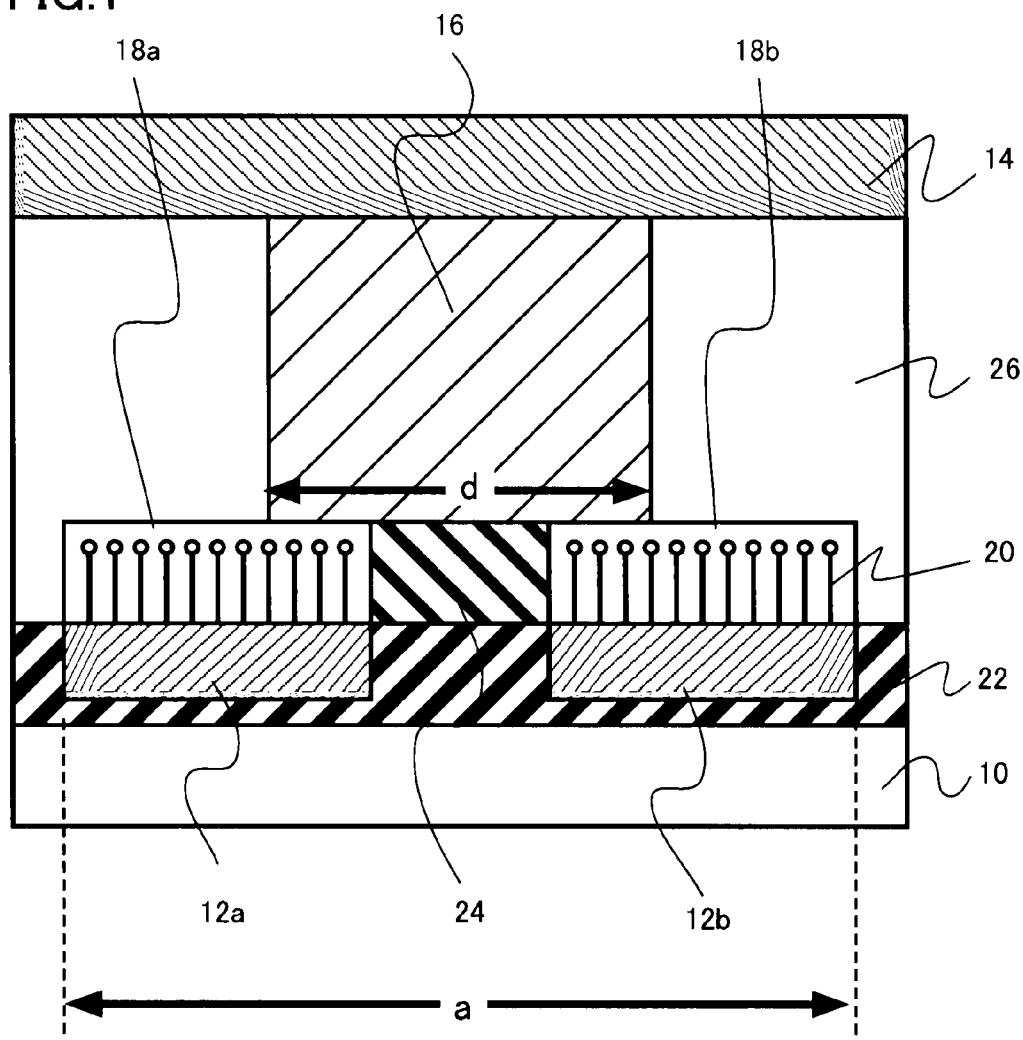

→ DIRECTION VERTICAL TO EXTENDING DIRECTION OF FIRST ELECTRODE WIRING

STORAGE DEVICE AND METHOD OF MANUFACTURING THE SAME

CROSS-REFERENCE TO RELATED APPLICATION

This application is based upon and claims the benefit of priority from Japanese Patent Application No. 2011-049184, filed on Mar. 7, 2011, the entire contents of which are incorporated herein by reference.

FIELD

Embodiments described herein relate generally to a storage device and a method of manufacturing the same.

BACKGROUND

Recently, an integration scale of semiconductor storage devices has been progressed and semiconductor storage devices using wiring width of 30 nm or less has been realized. If this trend continues, the wiring width of the semiconductor storage device will be in the order of 10 nm in a few years, and a new structure, material or process for further scaling down will be required.

With a conventional non-volatile semiconductor storage device using an oxide film for an insulation layer of a memory cell, if scaling down further proceeds, there is a concern that the insulation property of the oxide film does not function sufficiently. Hence, a trial has been made to reduce the size of a memory cell by, for example, using organic molecules in the memory cell.

Further, for example, lithography using the self-assembly phenomenon is proposed to realize ultrafine lithography at low cost.

BRIEF DESCRIPTION OF THE DRAWINGS

FIG. 1 is a schematic sectional view of a memory cell of a storage device according to a first embodiment;

DETAILED DESCRIPTION

A storage device according to the present embodiment includes: a plurality of first electrode wirings; a plurality of second electrode wirings which cross the first electrode wirings; a via plug which is formed between the second electrode wiring and two adjacent first electrode wirings, and in which a maximum diameter of a bottom surface opposing the first electrode wirings in a direction vertical to a direction in which the first electrode wirings stretch is smaller than a length corresponding to a pitch of the first electrode wiring plus a width of the first electrode wirings; a first storage element formed between the via plug and one of the first electrode wirings; and a second storage element which is formed between the via plug and the other one of the two first electrode wirings.

Hereinafter, embodiments will be described with reference to the drawings.

In addition, "resistance change type molecular chain" in this description refers to a molecular chain having a function of changing the resistance depending on whether or not there is the electric field or charges are injected.

Further, "chemical binding" in this description refers to a concept which refers to one of covalent binding, ion binding and metallic binding, and which does not include hydrogen binding or binding by means of the van der Waals force.

First Embodiment

A storage device according to the present embodiment has a plurality of first electrode wirings and a plurality of second electrode wirings crossing the first electrode wirings. Further, the storage device has one via plug formed between one second electrode wiring and two adjacent first electrode wirings. In this via plug, the maximum diameter of a bottom surface opposing the first electrode wirings in a direction vertical to a direction in which the first electrode wirings stretch is smaller than the length corresponding to the pitch of the first electrode wiring plus the width of the first electrode wirings. Further, the storage device has a first storage element formed between the via plug and one of the two first electrode wirings, and a second storage element between the via plug and the other one of the two first electrode wirings.

The storage device according to the present embodiment employs the above configuration and, consequently, can reduce an inter-wiring capacity between the first electrode wirings and second electrode wirings. Consequently, it is possible to suppress reading and writing errors caused by an increase of the inter-wiring capacity.

Figure 2A:
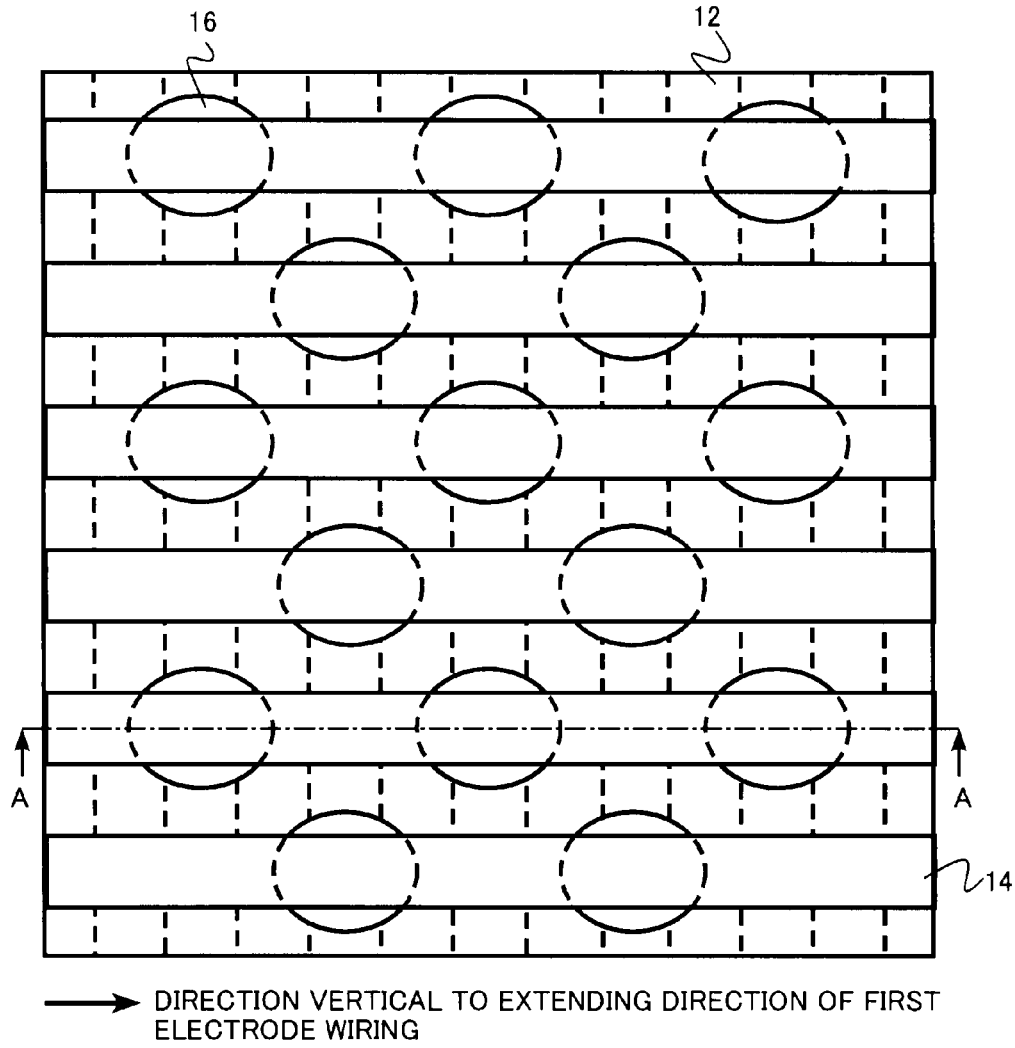
FIGS. 2A and 2B are schematic views of a storage device according to the first embodiment.
Figure 2B:
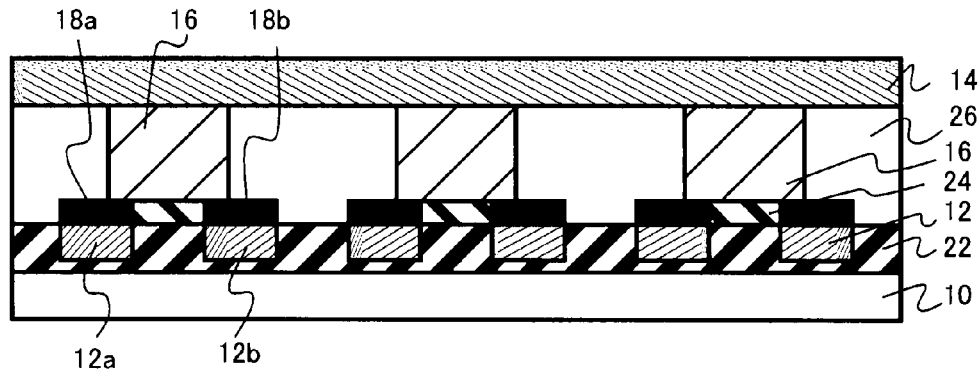

FIG. 2 is a schematic view of the storage device according to the present embodiment. FIG. 2A is a top view, and FIG. 2B is an AA sectional view of FIG. 2A. FIG. 1 is a schematic sectional view of the memory cell.

The storage device according to the present embodiment is a cross-point type organic molecular memory. As shown in FIGS. 1 and 2, a plurality of word lines (first electrode wirings) 12 are provided above a substrate 10.

Further, a plurality of bit lines (second electrode wirings) 14 are provided to cross and be orthogonal in FIG. 2 to the word lines 12. A design rule for the word lines and bit lines is, for example, about 5 to 20 nm.

Further, the storage device has one via plug 16 formed between one bit line 14 and two adjacent word lines 12a and 12b. In this via plug 16, the maximum diameter (d in FIG. 1) at the bottom surface, which is facing the first electrode wirings (word lines) 12 in the direction vertical to the extending direction of the first electrode wirings 12 is smaller than the length (a in FIG. 1) corresponding to a pitch of the first electrode wirings plus a width of the first electrode wirings. In other words, the maximum diameter of a bottom surface in a direction vertical to a direction in which the first electrode wirings extends, the bottom surface facing the first electrode wirings 12, is smaller than the length (a in FIG. 1) corresponding to the double width of the first electrode wirings plus the width between the first electrode wirings. It means that the via plug 16 only partially overlaps the word line 12a and the word line 12b.

Further, a first storage element 18a is formed between the via plug 16 and the word line 12a. Further, a second storage element 18b is formed between the via plug 16 and the word line 12b. Thus, the storage device according to the present embodiment adopts a structure in which one common via plug is formed for the two storage elements.

In the present embodiment, the first and second storage elements 18a and 18b are organic molecular layers including resistance change type molecular chains. A plurality of resistance change type molecular chains 20 form the organic molecular layer. Further, one ends of the resistance change type molecular chains 20 forming the organic molecular layers 18a and 18b chemically bind to the word lines 12, and the other ends do not chemically bind to the via plug 16.

A first insulation layer 22 is provided between the adjacent word lines 12. The first insulation layer 22 is, for example, a silicon nitride film. Further, a second insulation film 24 is provided between the organic molecular layers 18a and 18b. The second insulation layer 24 is, for example, a silicon oxide film. Further, a third insulation layer 26 is provided between the via plugs 16. The third insulation layer 26 is, for example, a silicon oxide film.

The substrate 10 is, for example, silicon having a (110) plane as a top surface. Further, the word line 12 is gold (Au) which is, for example, a metal material. The surface which is in contact with the organic molecular layers 18a and 18b of the word lines 12 is, for example, a (111) plane. Further, the bit line 14 and the via plug 16 are, for example, molybdenum (Mo) which is a metal material.

Figure 3:
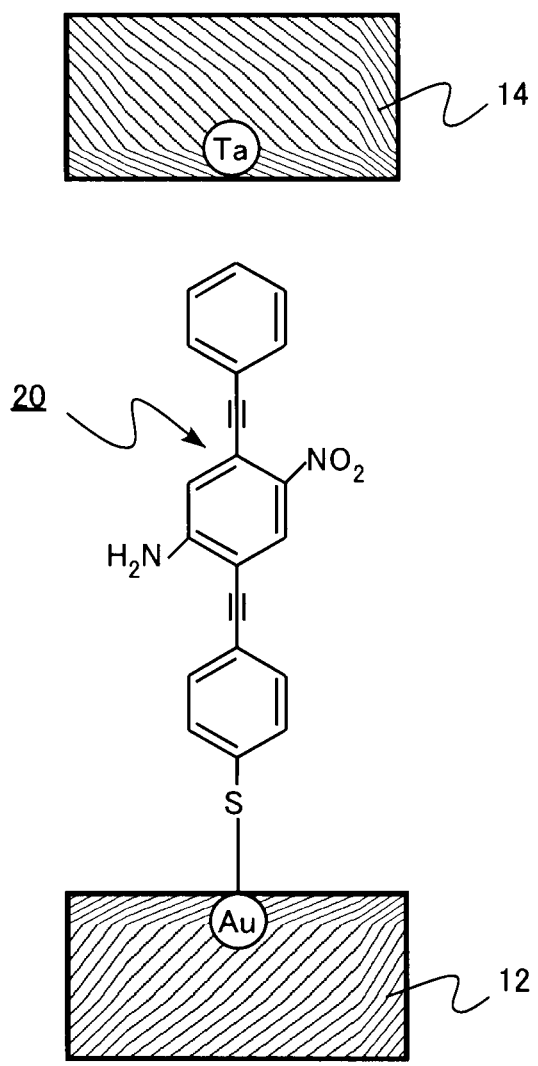
FIG. 3 is a view illustrating a molecular structure of a resistance change type molecular chain according to the first embodiment.
Figure 4A:
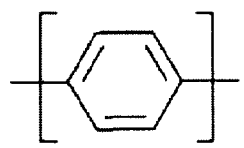
FIGS. 4A to 4F illustrate molecular units which can form a molecule having a π conjugated system stretch in one dimensional direction according to the first embodiment.
Figure 4D:
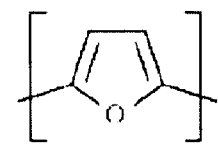
Figure 4B:
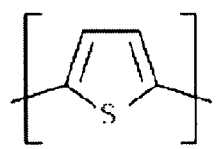
Figure 4E:
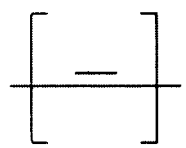
Figure 4C:
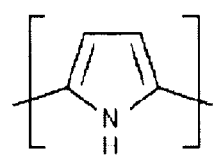
Figure 4F:
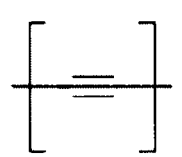

FIG. 3 is a view illustrating a molecular structure of a resistance change type molecular chain. The resistance change type molecular chains 20 forming the organic molecular layers 18a and 18b are, for example, 4-[2-amino-5-nitro-4-(phenylethynyl)phenylethynyl]benzenethiol as illustrated in FIG. 3.

In case of the resistance change type molecular chains 20 in FIG. 3, there is a thiol group at one end, and a sulfur atom (S) and gold atom (Au) on the surface of the word line 12 are chemically bound. By contrast with this, a benzene ring at the other end of the resistance change type molecular chain 20 is not chemically bound to a molybdenum (Mo) atom on the surface of the via plug 16.

The resistance change type molecular chain 20 has a function of changing the resistance depending on whether or not there is an electric field or charges are injected. For example, the resistance change type molecular chain having a molecular structure illustrated in FIG. 3 can switch between a low resistance state and a high resistance state by applying the voltage between both ends. By utilizing the change of this resistance state, a memory cell is realized.

In addition, in the present embodiment, of the resistance change type molecular chains 20 of the organic molecular layers 18a and 18b, only the resistance change type molecular chains 20 sandwiched by the word lines 12 and the via plug 16 can exhibit the memory function. The resistance change type molecular chains 20 sandwiched between the word lines 12 and the third insulation layer 26 do not exhibit the memory function.

In case of the cross-point type memory cell, when the memory cell is scaled down, the distance between the word lines and the bit line which are upper and lower electrode wirings becomes short following scaling down of the memory cell. For example, when organic molecules are used for the memory cell, the size of the organic molecule is, for example, about 0.5 nm to 5 nm. Hence, the distance between the word lines and the bit line also becomes about 0.5 nm to 5 nm accordingly.

When the distance between the word lines and the bit line becomes short, the inter-wiring capacity of the word lines and the bit line increases, thereby causing a problem that reading and writing errors occur due to the increase of the inter-wiring capacity. When the resistance change type molecular chains are used, the effect provided by a capacitor between the word lines and the bit line exceeds the effect provided by the change of the resistance state, and therefore there is a concern that reading and writing are not possible.

According to the present embodiment, by providing the via plug 16 between the word lines 12 and the bit line 14, the distance between the word lines 12 and the bit line 14 becomes longer. Consequently, the inter-wiring capacity of the word lines 12 and the bit line 14 is reduced.

Further, at intersections of the word lines 12 and the bit line 14, the via plug 16 and the word lines 12 only partially overlap without overlapping entirely.

Consequently, the capacity between the word lines 12 and the via plug 16 is also reduced. In view of this, the inter-wiring capacity of the word lines 12 and the bit line 14 is reduced.

Consequently, it is possible to suppress reading and writing errors caused by the increase in the inter-wiring capacity.

Further, a hole pattern for forming a via plug generally has more difficulty in scaling down than a line-and-space pattern. In the present embodiment, it is possible to relax the size and interval of the hole pattern compared to a case where one via plug is provided at the intersection of the word line 12 and the bit line 14. Consequently, it is expected that it is possible to easily manufacture products and improve the yield of the products.

When organic molecules which can exhibit the memory function with a significantly small volume are used for memory cells (storage elements), even if the via plug 16 and the word lines 12 only partially overlap, it is possible to sufficiently exhibit the memory function. When, for example, the word line width is about 10 nm, if the organic molecule has an area of about 3 nm$^2$ to 5 nm$^2$ on the word line, it is possible to exhibit the memory function. Consequently, the structure according to the present embodiment in which the word lines 12 only partially overlap the via plug 16 is useful particularly when organic molecules are used for memory cells as in the present embodiment.

Although 4-[2-amino-5-nitro-4-(phenylethynyl)phenylethynyl]benzenethiol illustrated in FIG. 3 has been described as an example of the resistance change type molecular chain 20, the resistance change type molecular chain 20 is not limited to the molecular chain in FIG. 3 as long as the molecular chain has the function of changing the resistance.

Examples of the resistance change type molecular chains include molecules having the π conjugated system stretched in the one dimensional direction such as 4-[2-amino-5-nitro-4-(phenylethynyl)phenylethynyl]benzenethiol illustrated in FIG. 3, its derivative, paraphenylene derivative, oligothiophene derivative, oligo-pyrrole derivative, oligo-furan derivative or paraphenylene vinylene derivative.

FIG. 4 illustrates molecular units which can form a molecule having the π conjugated system stretched in the one dimensional direction. FIG. 4A illustrates paraphenylene, FIG. 4B illustrates thiophene, FIG. 4C illustrates pyrrole, FIG. 4D illustrates furan, FIG. 4E illustrates ethenylene (vinylene) and FIG. 4F illustrates ethynylene.

First of all, when the length of the π conjugated system is short, electrons injected from electrodes pass without staying on molecules, and therefore the molecules preferably have a certain length to accumulate the charges and the number of π conjugation is preferably five or more in calculation in units of —CH=CH— in the one dimensional direction. The number of π conjugation corresponds to three or more in case of a benzene ring.

Further, when the length of the π conjugated system is long, there is a problem of a voltage drop due to conduction of a charge in a molecule. Hence, 20 (10 benzene rings in case of paraphenylene=a double expansion width of polaron which is the π conjugated system carrier) or less in calculation in units of —CH=CH— in one dimensional direction are preferable.

In addition, the distance between the word lines 12 and the via plug 16 is preferably 0.5 nm or more and 5.0 nm or less. When the distance is 0.5 nm or less, there is a concern that adequate organic molecules which function as memory cells do not exist. Further, when the distance exceeds 5.0 nm, the voltage drop in the organic molecular layers becomes significant, and there is a concern that memory cell characteristics deteriorate.

In addition, the distance between the word lines 12 and the via plug 16 can be measured using, for example, TEM (Transmission Electron Microscope).

In addition, the resistance change type molecular chain illustrated in FIG. 3 has diode characteristics of asymmetrical voltage-current characteristics. From the viewpoint of reducing a leak current in memory cells which are non-selected cells, the resistance change type molecular chains 20 preferably have diode characteristics. Further, the memory cell may employ a configuration having another diode element in addition to the resistance change type molecular chains 20.

A material of the electrode forming the organic molecular memory is not particularly limited to the above gold and molybdenum. However, the electrodes (the word lines 12 in the present embodiment) on a side to which linkers at one ends of the resistance change type molecular chains 20 chemically bind are preferably made of a material to which one ends of the resistance change type molecular chains 20 easily chemically bind to form a self-organizing film. Further, the electrode (the via plug 16 in the present embodiment) on a side of the other ends of the resistance change type molecular chains 20 is preferably made of a material to which one ends of the resistance change type molecular chains 20 do not easily chemically bind, from the viewpoint of forming the organic molecular layers using self-assembly after the electrode is formed.

The experiment shows that a desirable material varies depending on the structure of the linker at one end of the resistance change type molecular chain 20. For example, when the one end is the thiol group as illustrated in FIG. 3, the electrode to be chemically bound is preferably gold (Au), silver (Ag), copper (Cu), tungsten (W), tungsten nitride (WN$_2$), tantalum nitride (TaN) or titanium nitride (TiN), and gold (Au), silver (Ag) or tungsten (W) which can be particularly easily chemically bound among these is particularly preferable. By contrast with this, the electrode at the other end is tantalum (Ta), molybdenum (Mo), molybdenum nitride (MoN) or silicon (Si).

Further, when, for example, one end is an alcohol group or carboxyl group, the electrode on a side to be chemically bound is tungsten (W), tungsten nitride (WN$_2$), tantalum (Ta), tantalum nitride (TaN), molybdenum (Mo), molybdenum nitride (MoN) or titanium nitride (TiN), and tantalum (Ta), tantalum nitride (TaN), molybdenum nitride (MoN) or titanium nitride (TiN) which can be particularly easily chemically bound among these is particularly preferable. By contrast with this, the electrode at the other end is preferably gold (Au), silver (Ag), copper (Cu) or silicon (Si).

Further, when one end is a silanol group, for example, the electrode to be chemically bound is preferably silicon (Si) or a metal oxide. By contrast with this, the electrode at the other end is preferably gold (Au), silver (Ag), copper (Cu), tungsten (W), tungsten nitride (WN$_2$), tantalum (Ta), tantalum nitride (TaN), molybdenum (Mo), molybdenum nitride (MoN) or titanium nitride (TiN).

Further, a graphene or carbon nanotube is also applicable as an electrode material.

The structure according to the present embodiment is applicable not only to the organic molecular memory which uses organic molecules as memory cells but also to other storage devices such as ReRAM (Resistive Random Access Memory) which uses, for example, a metal oxide or silicon as memory cells.

Further, although a case has been described as an example where silicon is used for a material of the substrate 10, the material of the substrate 10 is by no means limited to this, an appropriate material only needs to be selected appropriately from, for example, a semiconductor material or insulation material taking into account the orientation of the electrode material formed on the substrate 10 and process consistency.

Further, an insulation material other than a silicon nitride film and a silicon oxide film can also be appropriately selected for the first insulation layer 22, the second insulation layer 24 and the third insulation layer 26.

FIGS. 5A to 9A and 5B to 9B are schematic views illustrating a storage device manufacturing method according to the present embodiment illustrated in FIGS. 1, 2A, 2B and 3. FIGS. 5A to 9A are top views and FIGS. 5B to 9B are sectional views corresponding to the AA cross-section in FIG. 2. Hereinafter, the manufacturing method according to the present embodiment will be described with reference to FIGS. 5A to 9A and 5B to 9B.

The method of manufacturing a storage device according to the present embodiment includes: forming on a substrate a plurality of first electrode wirings separated by a first insulation layer; forming a second insulation layer above the first electrode wirings; forming a via plug on the two adjacent first electrode wirings via the second insulation layer; etching the second insulation layer such that an undercut is provided in a rim side of the via plug; selectively chemically binding the resistance change type molecular chains on the first electrode wirings, and forming organic molecular layers between the first electrode wirings and the via plug; forming a third insulation layer on the first electrode wirings and around the via plug; and forming on the third insulation layer second electrode wirings which cross the first electrode wirings and which are in contact with the via plug.

Figure 5A:
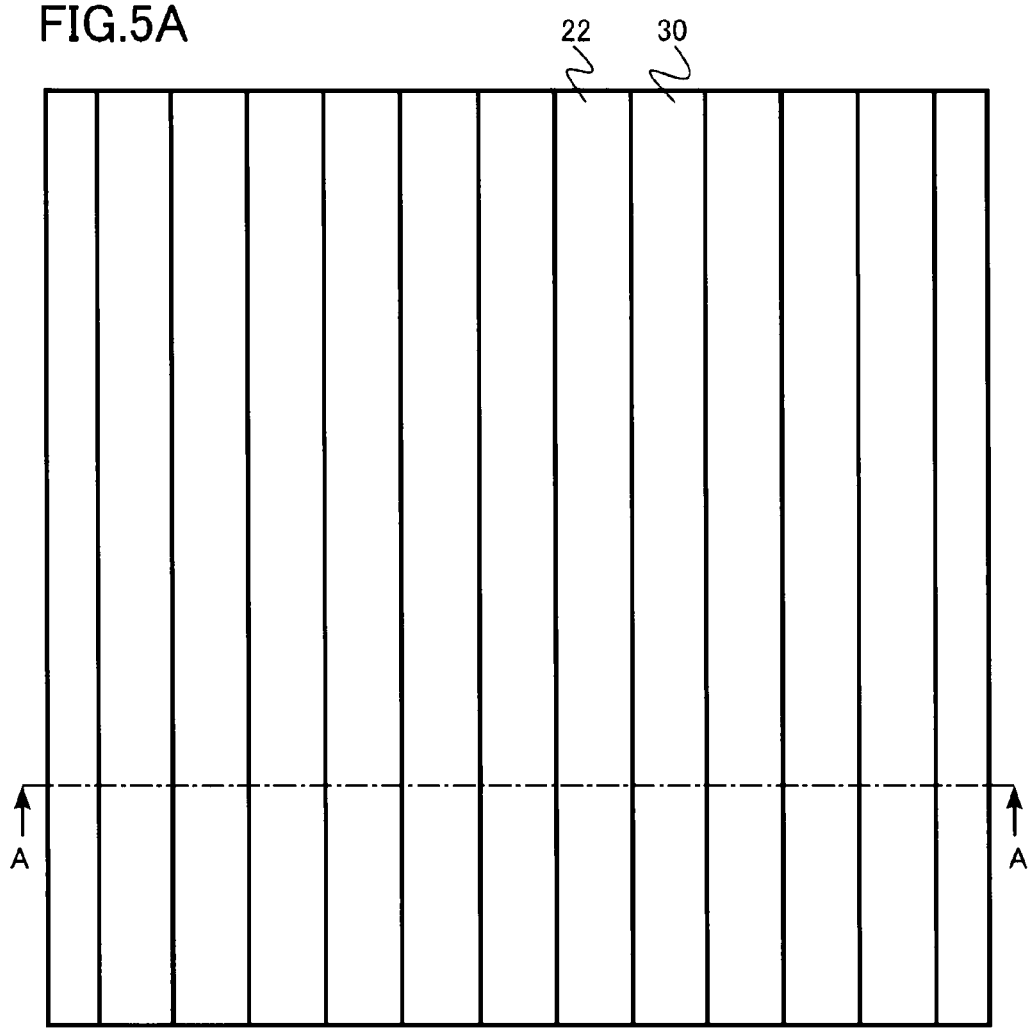
FIGS. 5A and 5B are schematic views illustrating a storage device manufacturing method according to the first embodiment.
Figure 5B:
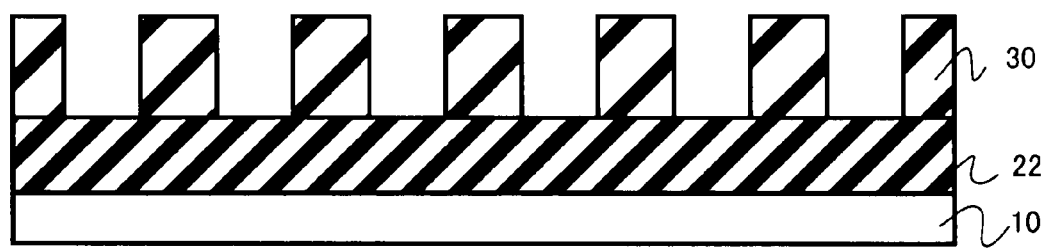

First, a silicon nitride film is deposited by, for example, a CVD method as the first insulation layer 22 on the silicon substrate 10. Next, a first patterning layer 30 is formed to form word lines (first electrode wirings) (FIGS. 5A and 5B). Patterning of this first patterning layer 30 uses a pattern transfer method using, for example, an oxide film and a carbon film.

More specifically, a carbon film, an SOG (Spin On Glass) film and a resist layer are formed on the first insulation layer 22. Then, the resist is first patterned by lithography. The formed resist pattern is transferred to the SOG film and the carbon film by a RIE (Reactive Ion Etching) method to form the first patterning layer 30.

Next, the first insulation layer 22 is etched by, for example, the RIE method using the first patterning layer 30 as a mask. Further, the first patterning layer 30 is selectively removed from the first insulation layer 22.

Figure 6A:
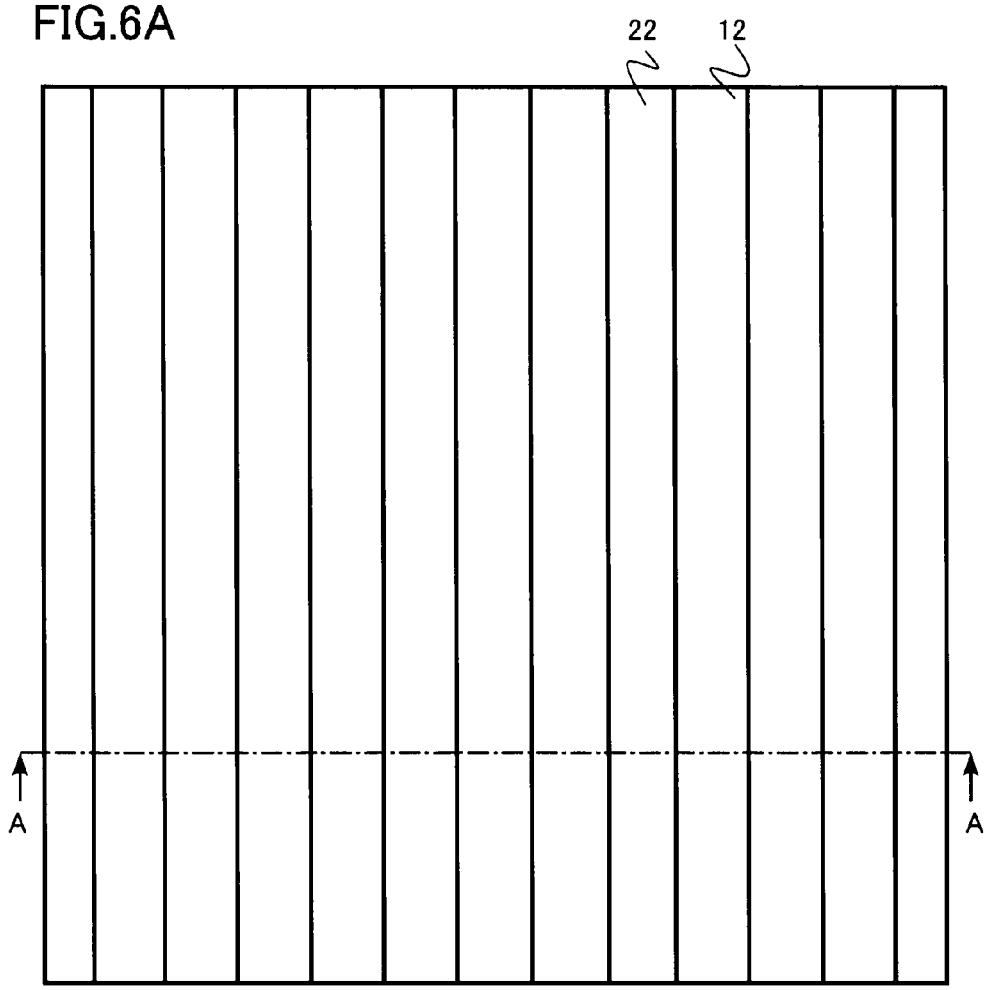
FIGS. 6A and 6B are schematic views illustrating a storage device manufacturing method according to the first embodiment.
Figure 6B:
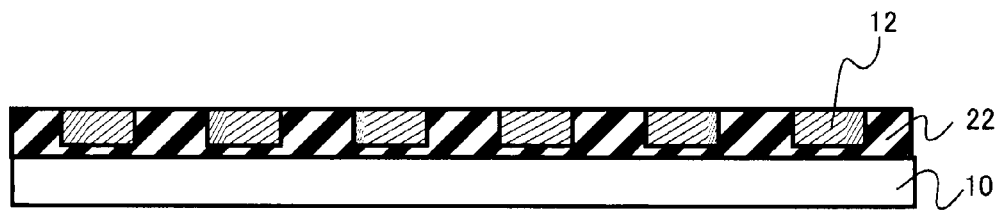

Then, gold (Au) which is an electrode material of the word lines (first electrode wirings) 12 is formed by, for example, deposition. Further, extra gold is removed using a CMP (Chemical Mechanical Polishing) method to form the word lines 12 (FIGS. 6A and 6B). Meanwhile, the surface of the word lines 12 becomes gold on the (111) plane.

Next, the second insulation layer 24 of, for example, a silicon oxide film is formed on the word lines 12. The thickness of the second insulation layer 24 defines the thickness of the organic molecular layers later. Consequently, precise control is preferably performed. Hence, for example, process having high performance of controlling the film thickness such as an ALD (Atomic Layer Deposition) method is preferably adopted.

Figure 7A:
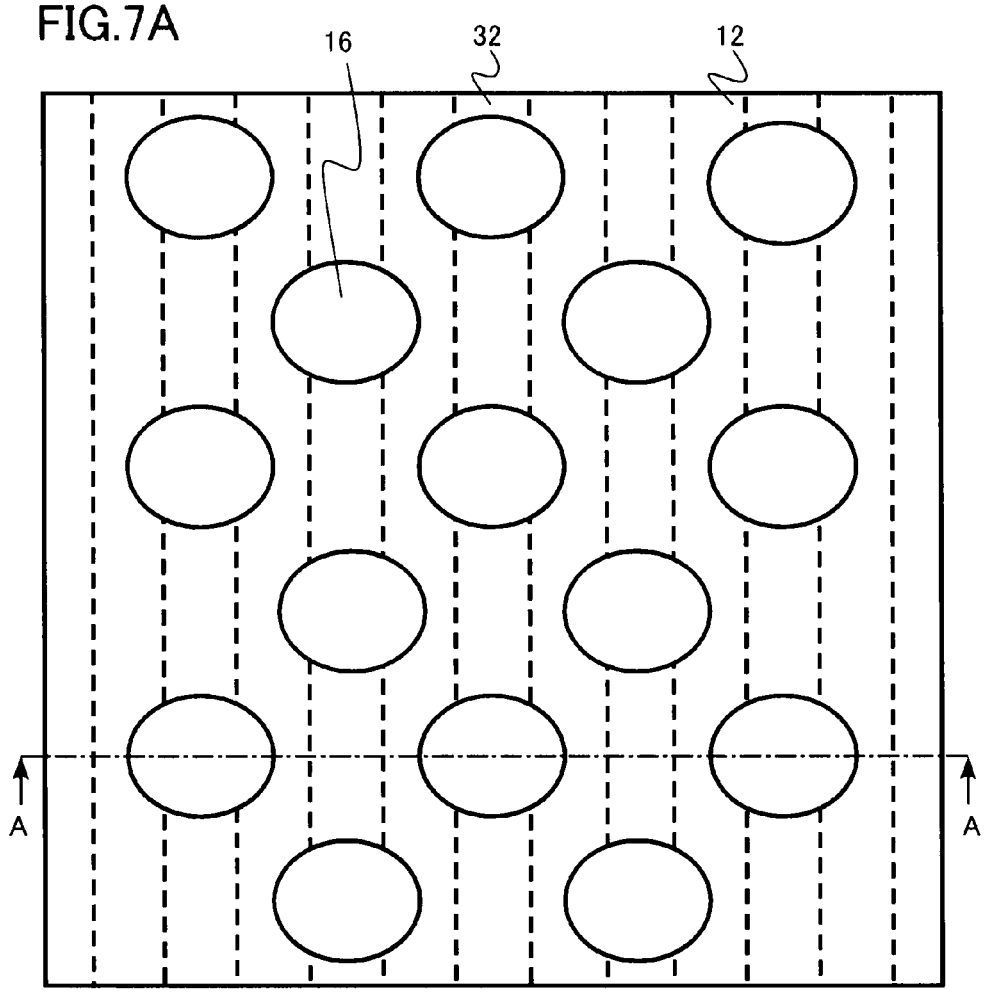
FIGS. 7A and 7B are schematic views illustrating a storage device manufacturing method according to the first embodiment.
Figure 7B:
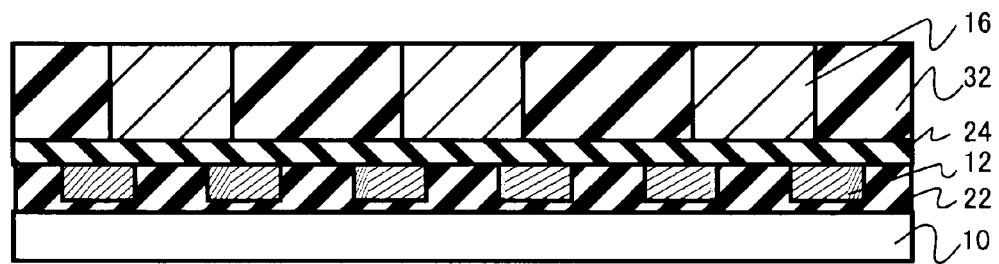

Next, a hole pattern for the via plug 16 is formed. By the same method as formation of the word lines 12, the second patterning layer 32 is formed using the pattern transfer method. Then, molybdenum (Mo) is deposited by, for example, the sputtering method and then extra molybdenum is removed by the CMP method. By this means, the via plug 16 is formed via the second insulation layer 24 on the two adjacent word lines (FIGS. 7A and 7B).

Figure 8A:
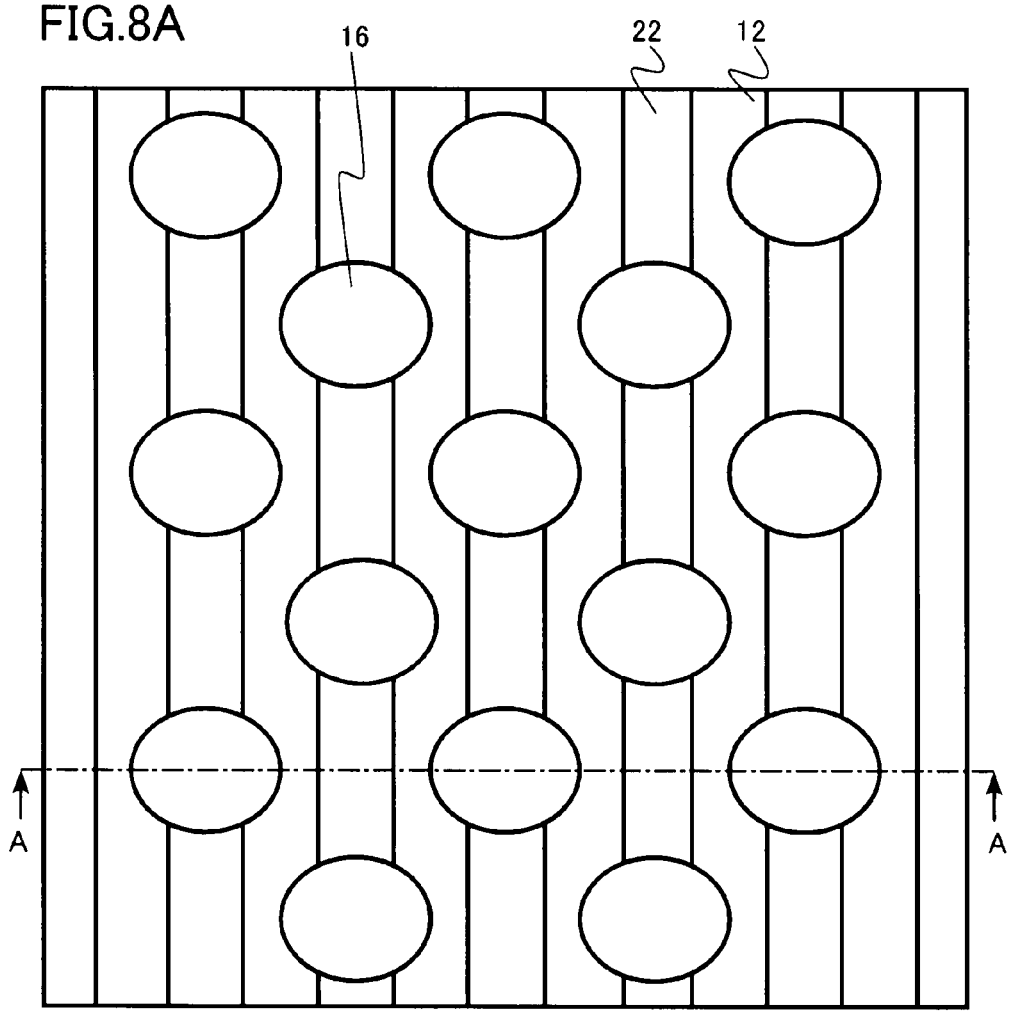
FIGS. 8A and 8B are schematic views illustrating a storage device manufacturing method according to the first embodiment.
Figure 8B:
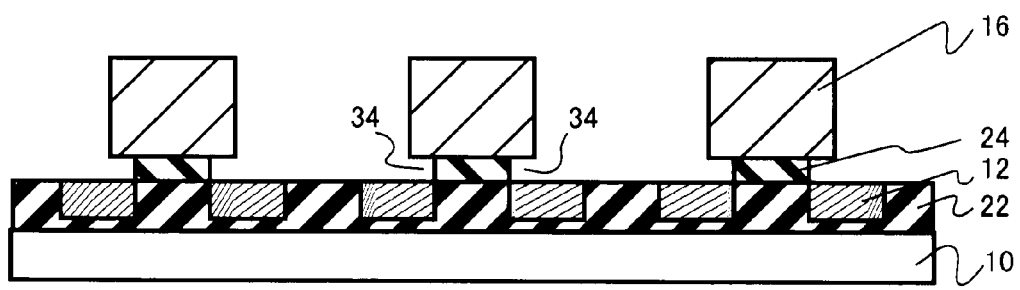

Next, the second patterning layer 32 is selectively removed from the second insulation layer 24. The second insulation layer 24 is etched such that an undercut 34 is provided in a rim side of the via plug 16 (FIGS. 8A and 8B). When the first insulation layer 22 is a silicon nitride film and the second insulation layer 24 is a silicon oxide film, for example, diluted hydrofluoric acid can be used for etching. Thus, gaps are formed between the word lines 12 and the via plug 16.

Next, the resistance change type molecular chains are adsorbed on the word lines 12 by self-assembling method, the organic molecular layers 18a and 18b are formed. For example, a solution made by dispersing the resistance change type molecular chains 20 having the structure illustrated in FIG. 3 in, for example, a toluene solution is prepared. Further, in this solution, the structure formed on the substrate 10 is immersed. Then, the structure is rinsed and dried.

In this case, the thiol groups of the resistance change type molecular chains 20 chemically bind selectively to the word lines 12 made of gold, not to the via plug 16 made of molybdenum. This process forms the organic molecular layers 18a and 18b which are self-assembled monolayers (SAHs) between at least the word lines 12 and the via plug 16 (FIG. 9).

Next, the space between the via plugs 16 is buried by, for example, a silicon oxide film and planarized by the CMP method to form the third insulation layer 26.

Figure 10A:
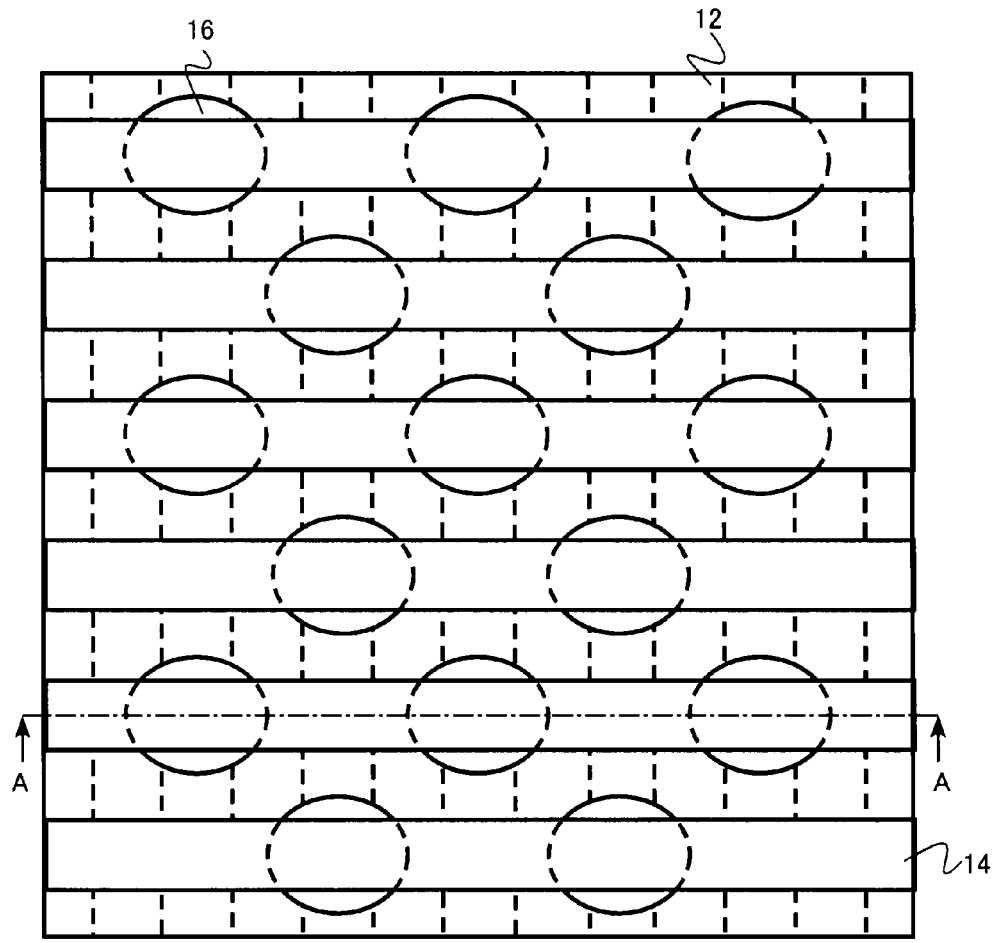
FIGS. 10A and 10B are schematic views illustrating a storage device manufacturing method according to the first embodiment.
Figure 10B:
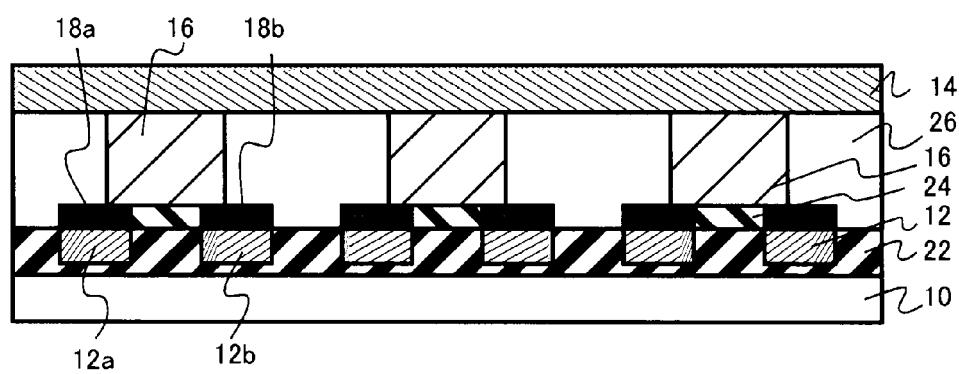

Next, molybdenum is deposited on the third insulation layer 26 as a material for the bit line 14 by the sputtering method. Then, by an etching technique such as the same lithography technique or RIE method as formation of the word lines 12, the molybdenum layer 34 is patterned as a plurality of lines which are connected with the via plug 16, and which cross the word lines 12 to form the bit lines 14 (FIG. 10).

According to the above manufacturing method, the storage device according to the present embodiment illustrated in FIGS. 1, 2A, 2B and 3 is formed.

Second Embodiment

The storage device according to the present embodiment is the same as in the first embodiment except that resistance change type molecular chains in the organic molecular layers chemically bind to a via plug, not to the word lines (first electrode wirings). Therefore, overlapping contents of the first embodiment will not be repeated.

Figure 11:
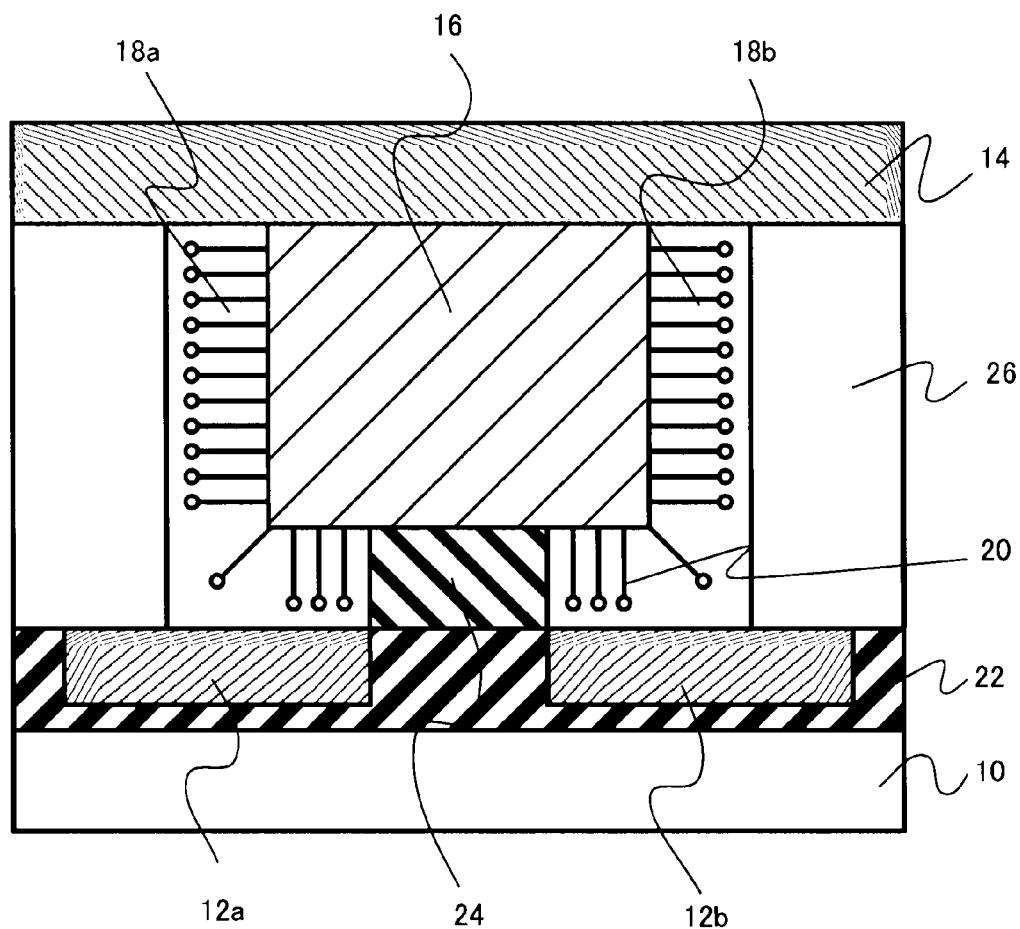
FIG. 11 is a schematic sectional view of a memory cell of a storage device according to a second embodiment.

FIG. 11 is a schematic sectional view of a storage device according to the present embodiment, and is a schematic sectional view of the memory cell.

In the present embodiment, one ends of resistance change type molecular chains 20 in organic molecular layers 18a and 18b chemically bind to a via plug 16 as illustrated in FIG. 11. This structure can be realized using, for a material of the via plug 16, a material to which the resistance change type molecular chains 20 are easily chemically bound. For example, the molecular chain illustrated in FIG. 3 can be applied as the resistance change type molecular chains 20 using gold (Au) for the material of the via plug 16 and molybdenum (Mo) for the material of the word lines 12. This structure is effective when organic molecules are not conductive in the horizontal direction.

Also in the present embodiment, it is possible to realize the same effect as in the first embodiment.

Third Embodiment

A storage device manufacturing method according to the present embodiment is the same as in the first embodiment except that word lines and a via plug are formed by applying a block copolymer to respective patterns, this block copolymer is formed in a domain and this domain is used as a template. That is, the present embodiment is the same as the first embodiment except that lithography using self-assembly is applied for lithography. Therefore, overlapping contents of the first embodiment will not be repeated.

FIGS. 12A to 18A and 12B to 18B are schematic views illustrating another manufacturing method of an organic molecular memory illustrated in FIGS. 1, 2A, 2B and 3. FIGS. 12A to 18A are top views and FIGS. 12B to 18B are sectional views corresponding to the AA cross-section in FIG. 2. Hereinafter, the manufacturing method according to the present embodiment will be described with reference to FIGS. 12A to 18A and 12B to 18B.

The storage device manufacturing method according to the present embodiment uses the self-assembly phenomenon of the block copolymer. By this means, low cost manufacture of a fine storage device is easily realized.

First, a silicon nitride film is deposited by, for example, a CVD method as the first insulation layer 22 on the substrate 10 on a (110) plane. Next, a first patterning layer 30 is formed to form word lines (first electrode wirings). This first patterning layer 30 is, for example, an oxide film and a carbon film on this oxide film.

Figure 12A:
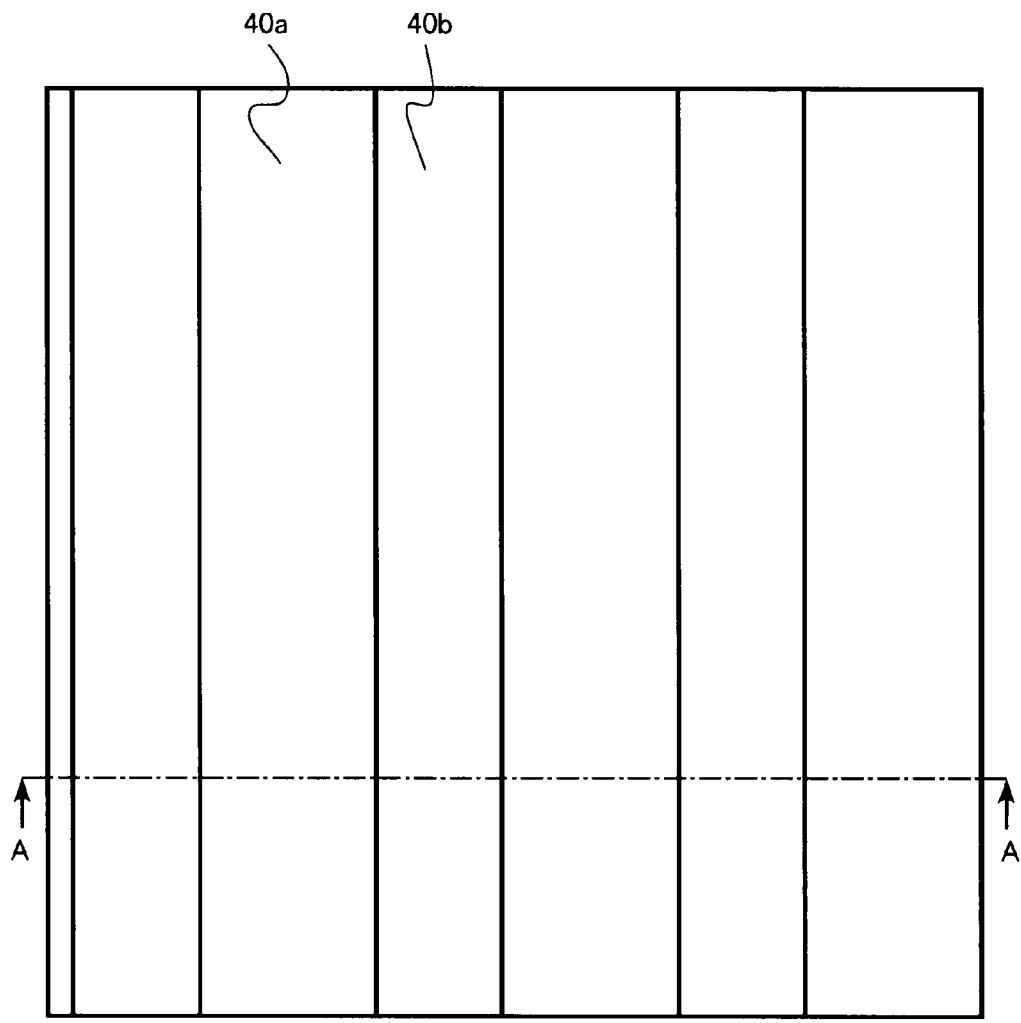
FIGS. 12A and 12B are schematic views illustrating a storage device manufacturing method according to a third embodiment.
Figure 12B:
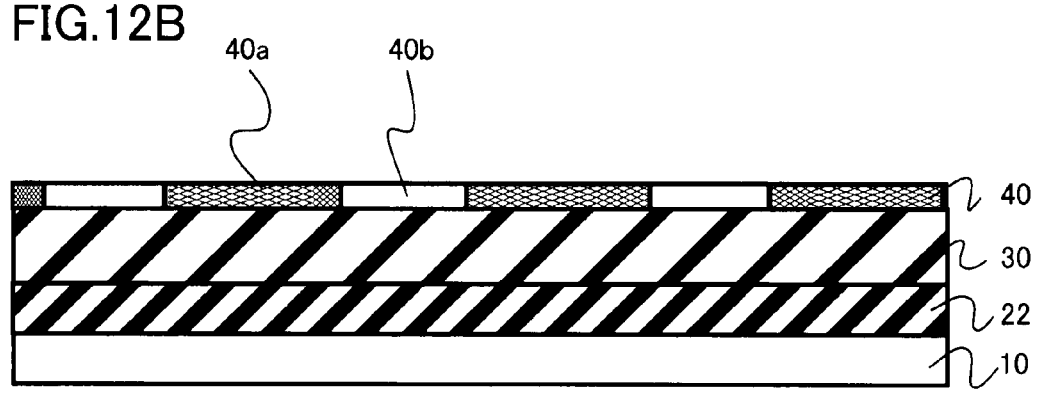

For example, 1H, 1H, 2H, 2H-Perfluorodecyltriethoxysilane is coated on the first patterning layer 30. Then, the first patterning layer 30 is exposed using an ArF exposure device to provide a line-and-space pattern having the pitch twice the desired pitch of word lines 12 to form the word lines 12. The material used in this process is used to align the upper block copolymer by varying surface energy between the polarity, neutrality, nonpolarity. Hence, in addition to the above material, a silane coupling agent, organosilane derivative, or random copolymer (for example, a random copolymer of PS and PMMA) used for the block copolymer may be used. Areas which are irradiated with light by this exposure become hydrophilic areas 40a, and areas which are not irradiated with light become hydrophobic areas 40b (FIGS. 12A and 12B).

Figure 13A:
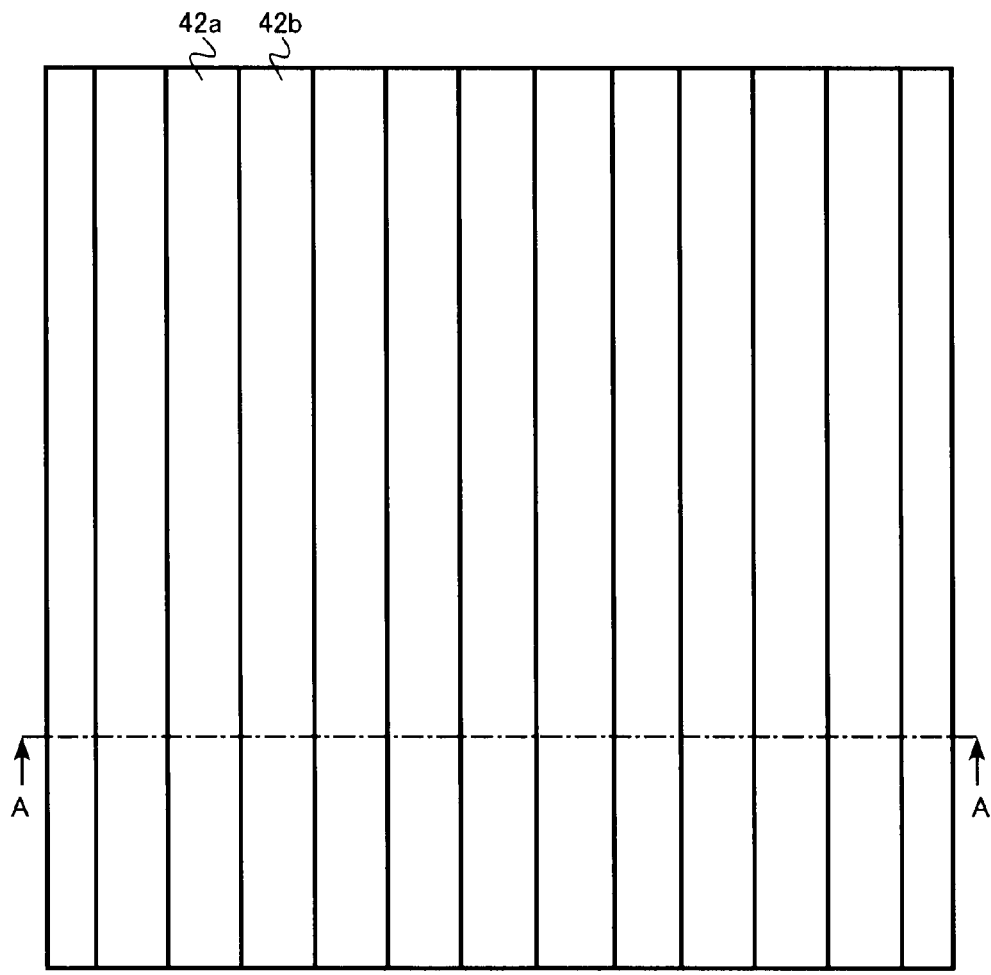
FIGS. 13A and 13B are schematic views illustrating a storage device manufacturing method according to the third embodiment.
Figure 13B:
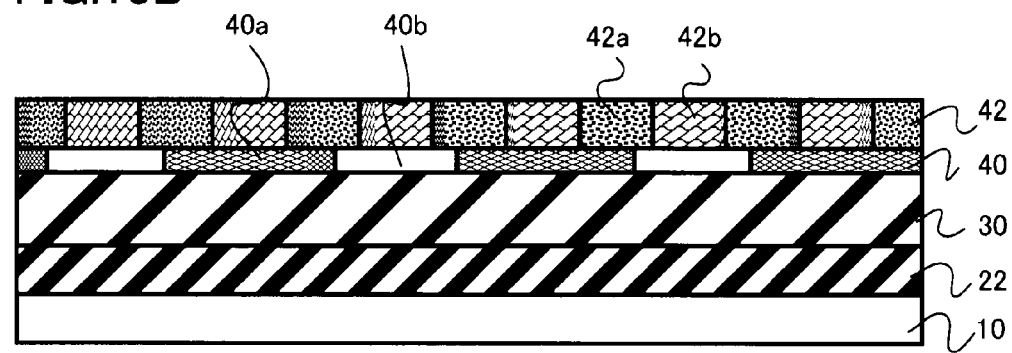

Next, a resist dissolved in a resist solution (Propylene glycol monomethyl ether acetate: PGMEA) of PS-b-PMMA which is the block copolymer is coated as, for example, the second polymer 42. In this case, stripe domains of PS lines 42a and PMMA lines 42b are formed for the second polymer 42 according to hydrophilic and hydrophobic patterns of the first polymer 40 of the underlayer. The stripe domains are formed at the same pitch as the word lines 12 (FIGS. 13A and 13B).

The pattern of the word lines 12 is formed using these domains as a template. That is, the domain pattern is transferred as the pattern of the word lines 12. As for PS and PMMA, PS has more etching resistance against the RIE method. Consequently, it is possible to selectively etch PMMA.

Figure 14A:
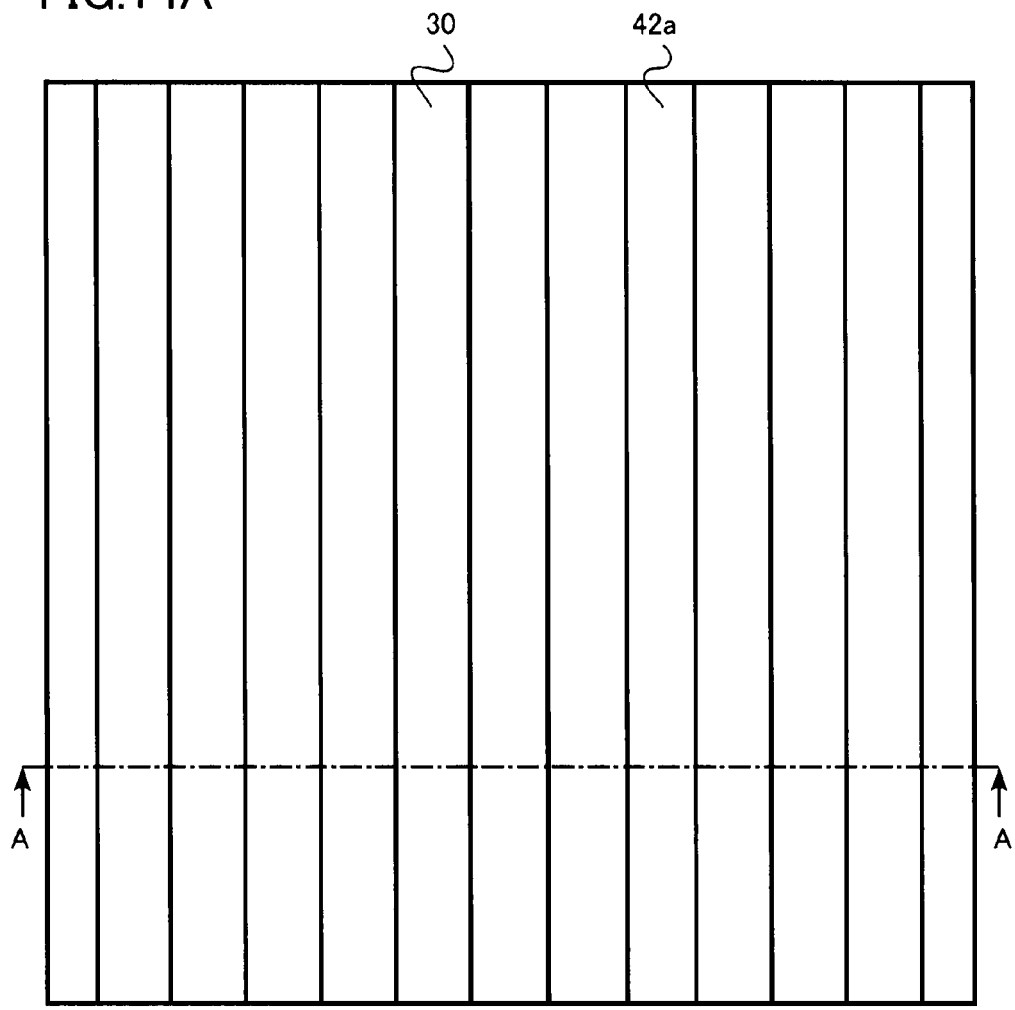
FIGS. 14A and 14B are schematic views illustrating a storage device manufacturing method according to the third embodiment.
Figure 14B:
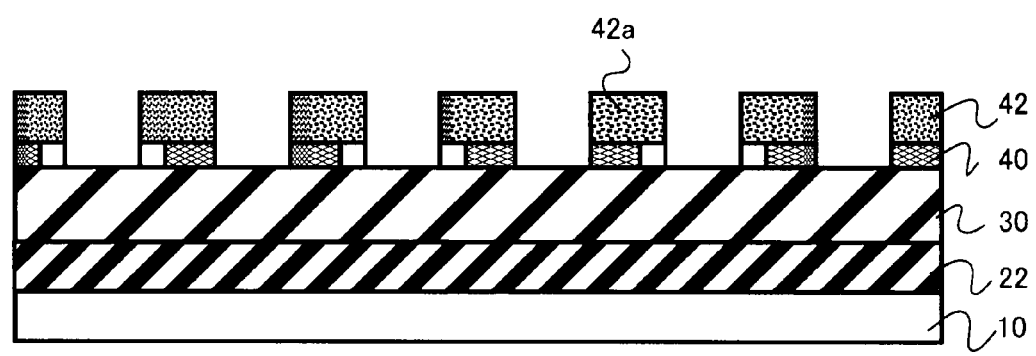
Figure 15A:
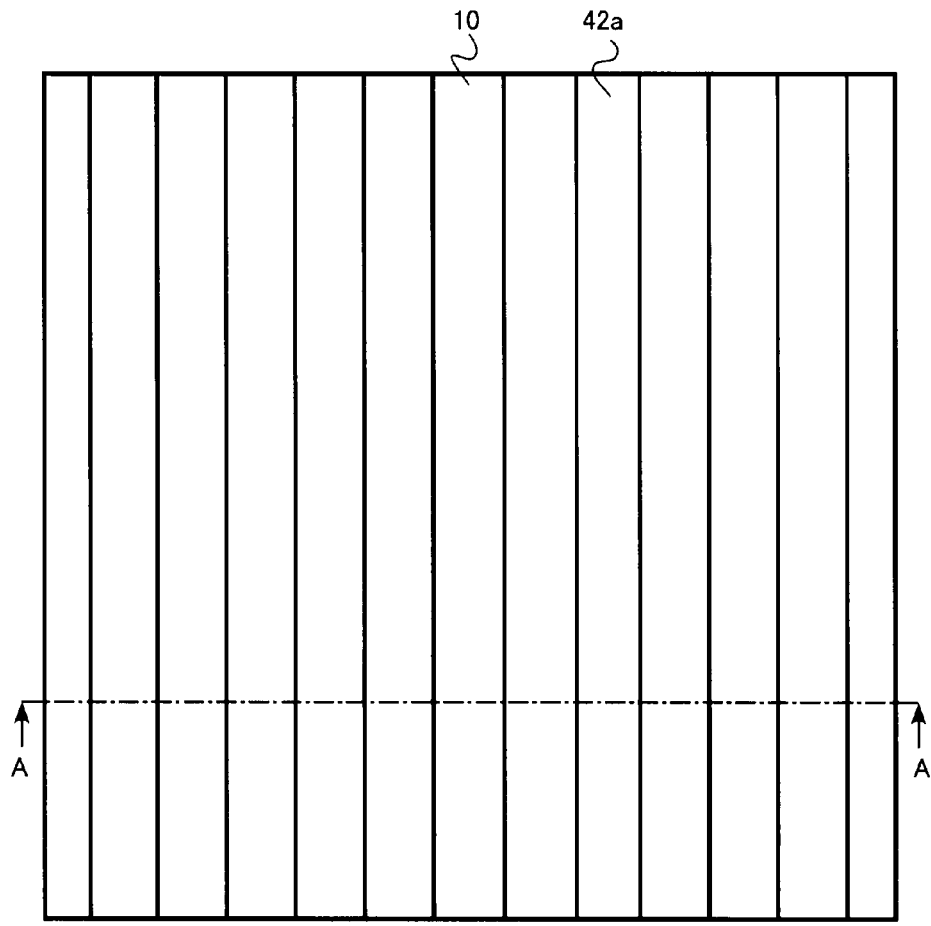
FIGS. 15A and 15B are schematic views illustrating a storage device manufacturing method according to the third embodiment.
Figure 15B:
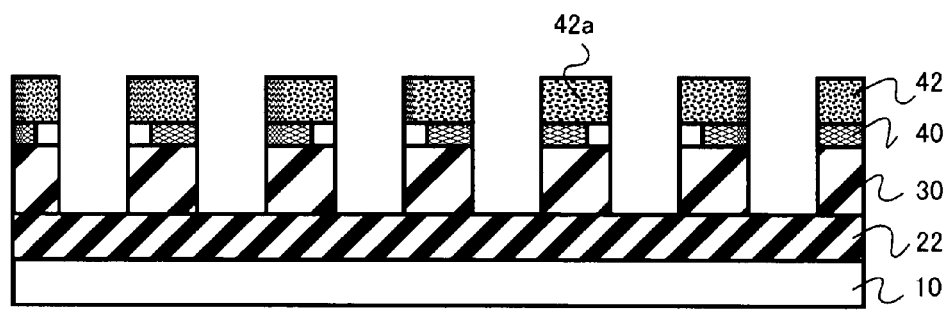
Figure 16A:
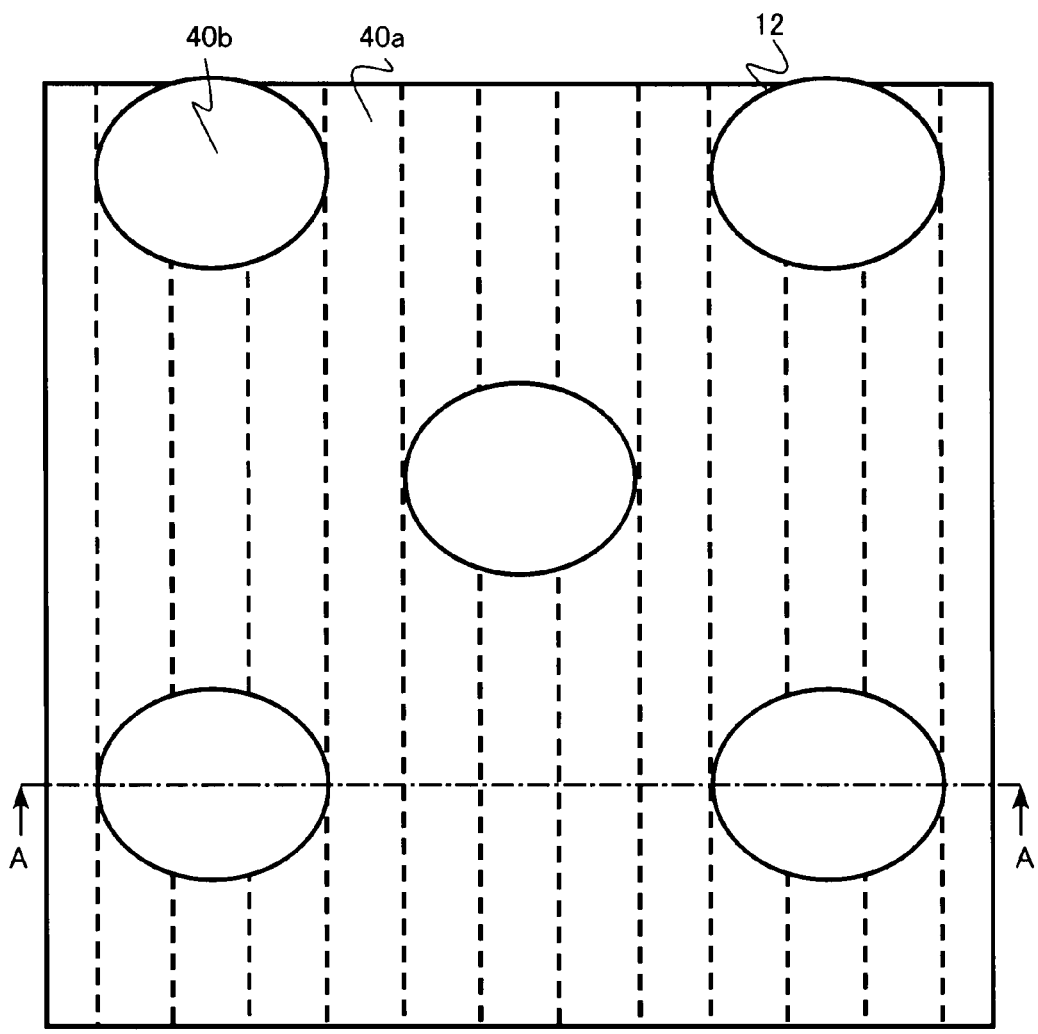
FIGS. 16A and 16B are schematic views illustrating a storage device manufacturing method according to the third embodiment.
Figure 16B:
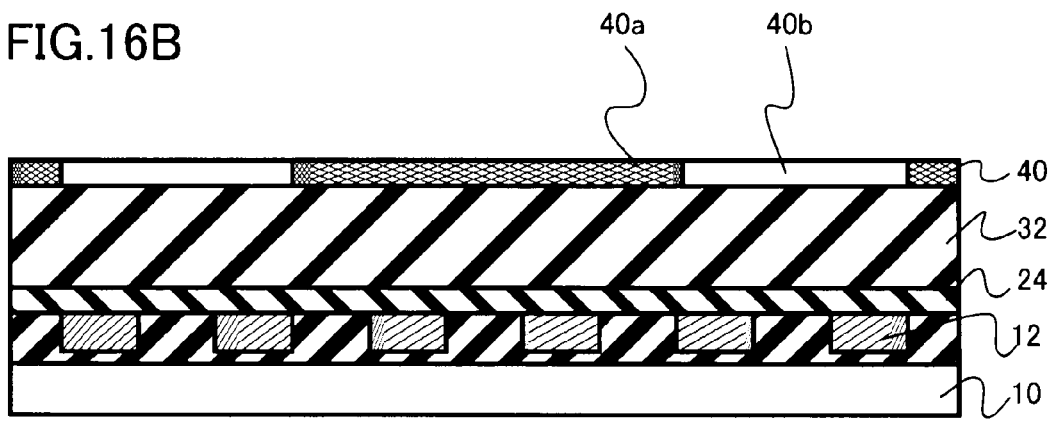

Hence, PMMA lines 42b are selectively removed by the RIE method (FIGS. 14A and 14B). Further, using this pattern, the first patterning layer 30 of the underlayer is etched by RIE (FIGS. 15A and 15B).

The subsequent process of etching the first insulation layer 22, then forming the word lines 12 and forming the second insulation layer 24 is the same as the first embodiment. Further, a second patterning layer 32 is formed on the second insulation layer 24.

Further, similar to patterning of the word lines 12, the first polymer 40, for example, 1H, 1H, 2H, 2H-Perfluorodecyltriethoxysilane is coated. Then, using, for example, the ArF exposure device, exposure is performed to provide a pattern illustrated in FIG. 16A to form a via plug. Areas which are irradiated with light by this exposure become hydrophilic areas 40a, and areas which are not irradiated with light become hydrophobic areas 40b.

Figure 17A:
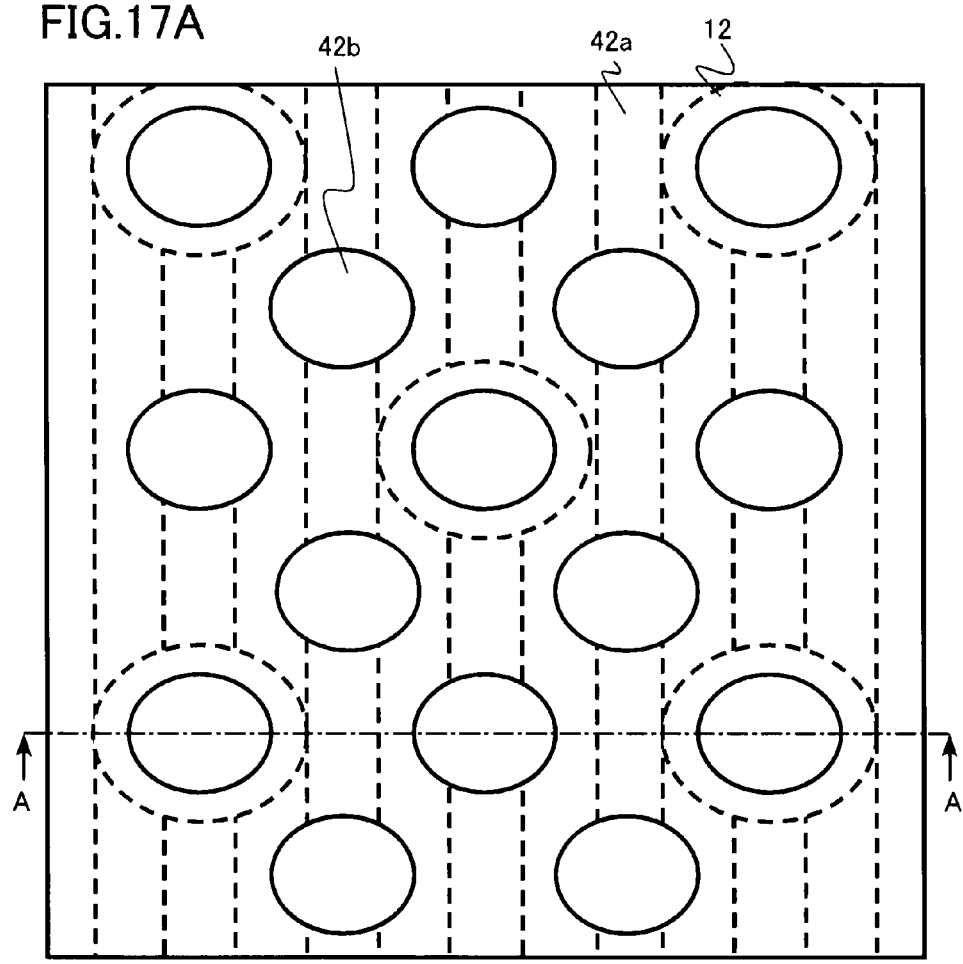
FIGS. 17A and 17B are schematic views illustrating a storage device manufacturing method according to the third embodiment.
Figure 17B:
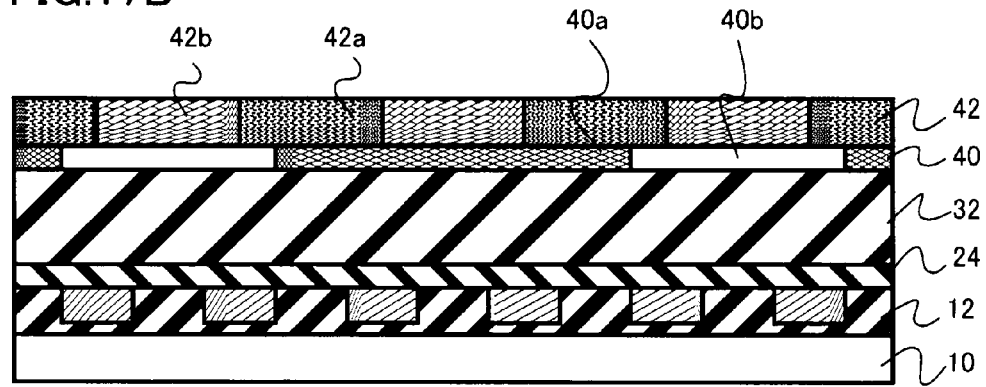

Next, a resist dissolved in a resist solution (Propylene glycol monomethyl ether acetate: PGMEA) of PS-b-PMMA which is the block copolymer is coated as, for example, the second polymer 42. In this case, houndstooth check domain patterns of PS areas 42a and PMMA areas 42b illustrated in FIG. 17A are formed in the second polymer 42 according to hydrophilic and hydrophobic patterns of the first polymer 40 of the underlayer. This houndstooth check pattern becomes the hole pattern for the via plug.

Figure 18A:
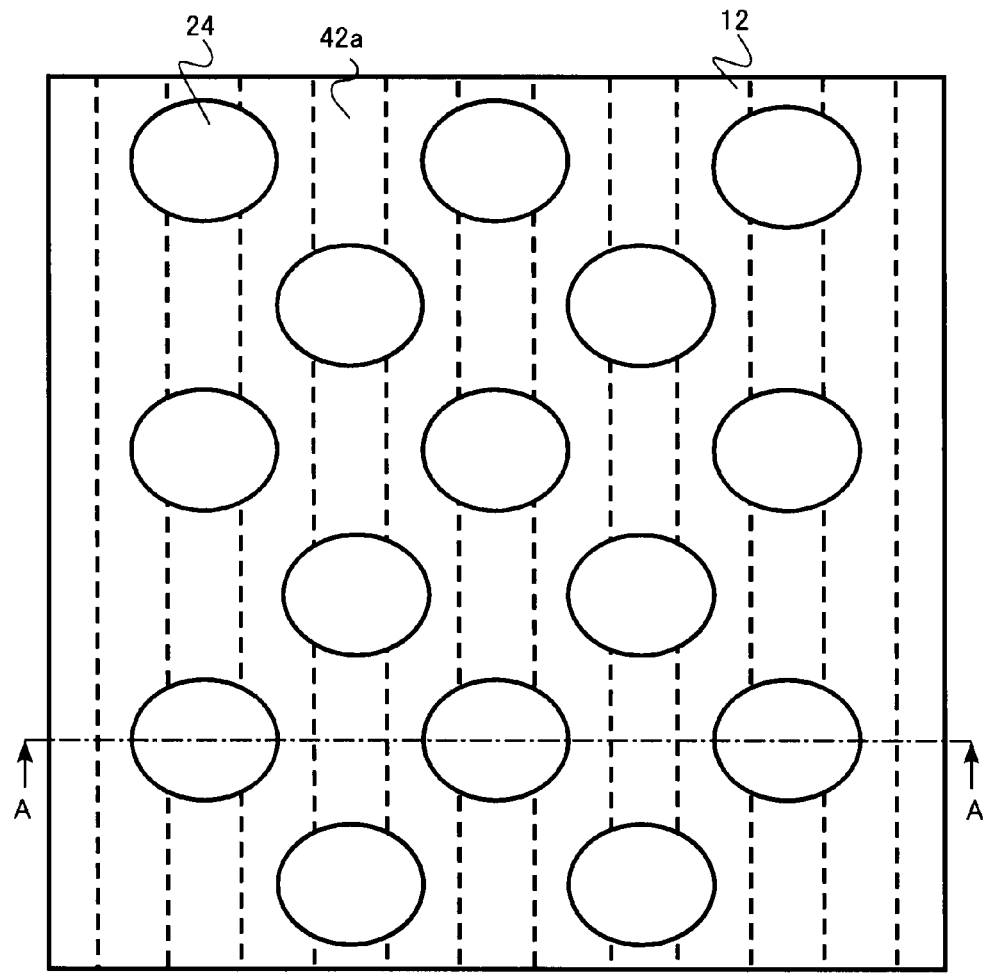
FIGS. 18A and 18B are schematic views illustrating a storage device manufacturing method according to the third embodiment.
Figure 18B:
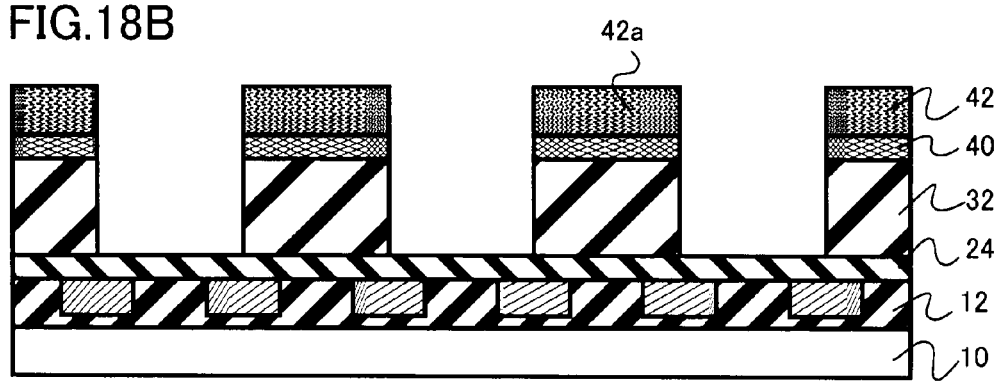

Next, the pattern of the via plug 16 is formed using the above domains as a template. That is, the domain pattern is transferred as the pattern of the via plug 16. First, the PMMA areas 42b are selectively removed by the RIE method. Further, the first patterning layer 30 of the underlayer is etched by RIE (FIGS. 18A and 18B).

Subsequent formation of the via plug 16 to formation of the bit line 14 are the same as the first embodiment.

In the present embodiment, according to patterning using self-assembly, it is possible to easily realize a fine pattern at lower cost than optical lithography. Particularly, patterning using self-assembly is suitable for a pattern which has more difficulty in miniaturization than the line-and-space as in the hole pattern for forming the via plug. Further, the sizes formed by respective self-organizing materials are determined, so that the self-organizing materials provide an advantage of a pattern self-repairing function of the positions and sizes.

EXAMPLES

Hereinafter, examples will be described.

Example 1

A storage device is made using the manufacturing method described in the first embodiment. The manufacturing method according to the present embodiment will be described with reference to FIGS. 5A to 9A and 5B to 9B.

A silicon nitride film (first insulation layer 22) having the thickness of 50 nm is deposited on a silicon wafer using the chemical vapor deposition (CVD) method. Next, the line-and-space pattern of 50 nm is resolved using optical lithography which uses an ArF excimer laser. In addition, only the ArF resist cannot provide a sufficient aspect ratio of the resist which is an etching mask, so that the resist pattern of a sufficient aspect ratio is provided using the pattern transfer method using the oxide film and carbon film as the first patterning layer 30.

The carbon film made by dissolving a novolac resin solvent (propylene glycol monomethyl ether acetate: PGMEA) is used. The film is thermally cured by being spin coated to have the thickness of 200 nm, then baked at 180° C. for 60 seconds on a hotplate and further baked 300° C. for 60 seconds on another hotplate.

Next, SOG (Spin on Glass) is vitrified by being spin-coated, baked at 200° C. for 60 seconds on the hotplate and then further baked at 300° C. for 60 seconds on another hotplate. The film thickness is 30 nm.

Next, the SOG is spin-coated with a chemically-amplified ArF resist (AR2395JSR), and baked for at 120° C. for 60 seconds on the hotplate. An ArF excimer laser exposure equipment (NA: 095 and dry) is used for exposure. The SOG is exposed with the exposure amount of 25 mJ/$cm^2$ and baked at 125° C. for 60 seconds on the hotplate to develop using tetra-methyl ammonium hydroxide (TMAH) 2.38% solution (resist developer).

Further, an etching is performed at 10 mTorr by 100 W by means of $CF_4$ gas using RIE and the SOG is removed. Next, a mask pattern formed with a carbon film is etched at 10 mTorr with 100 W using oxygen RIE (FIGS. 5A and 5B).

Using this mask pattern as a mask, a silicon nitride film (first insulation layer 22) is etched according to the RIE method using $CF_4$ and processed in the line-and-space pattern.

Next, gold is deposited by the deposition method. Extra gold is removed using CMP and is simultaneously planarized.

The gold wirings of the line-and-space pattern of 50 nm fabricated in this way function as the word lines 12 (FIGS. 6A and 6B).

Next, a silicon oxide film (second insulation layer 24) of 2 nm is formed according to an atomic layer deposition (ALD) method. Further, a hole pattern having the diameter of 70 nm is fabricated to match a space portion of the gold wirings by using ArF lithography and transferring the pattern to the carbon film and oxide film.

Molybdenum is deposited by sputtering, and extra molybdenum is removed by CMP. Further, the resist is removed by oxygen ashing and the via plug 16 made of molybdenum is made (FIGS. 7A and 7B).

Next, the oxide film (second insulation layer 24) deposited by ALD using diluted hydrofluoric acid is scraped, and the oxide film of several nm between the via plug 16 and the word lines 12 is also removed from the edge. That is, the oxide film is etched such that an undercut is provided (FIGS. 8A and 8B).

Figure 9A:
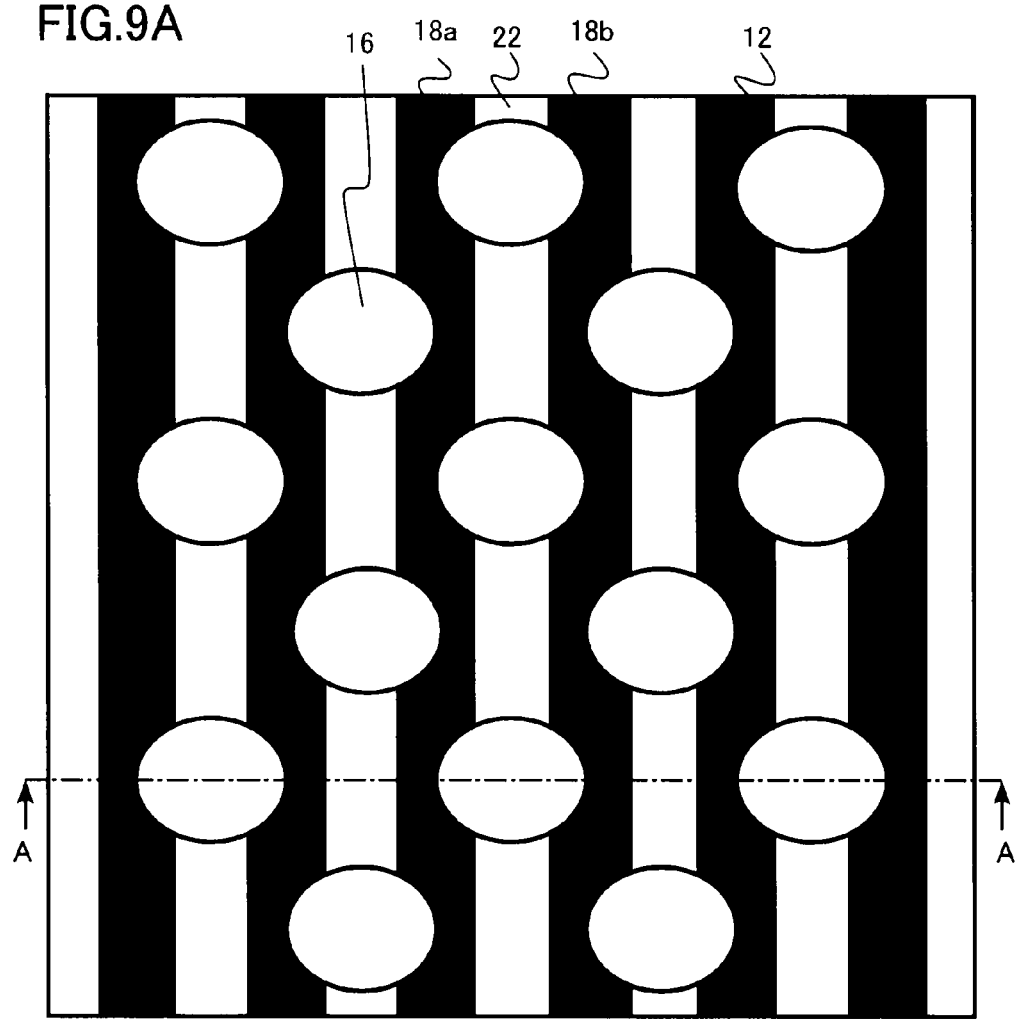
FIGS. 9A and 9B are schematic views illustrating a storage device manufacturing method according to the first embodiment.
Figure 9B:
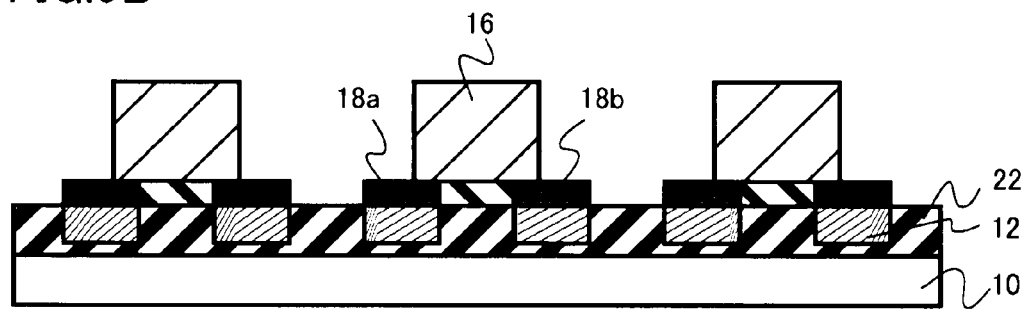

Next, the oxide film is immersed in a toluene solution in which SAM molecules (4-[2-amino-5-nitro-4-(phenylethynyl)phenylethynyl]benzenethiol) are dissolved, and thiol groups of SAM molecules are adsorbed to the gold wirings. These SAM molecules are reported to have diode characteristics and memory capacity. In this case, the thiol groups of the SAM molecules selectively adsorbed to gold without adsorbing to the molybdenum side (FIGS. 9A and 9B).

Next, SOG is coated and planarized. Although SOG is calcinated at 300° C., thermal resistance of the SAM molecules used in the present invention is close to 400° C., and is not dissolved in this process. The SAM molecules are further planarized by CMP.

Molybdenum is deposited by sputtering again. Next, using ArF lithography using the same condition as formation of the word lines 12, the line-and-space pattern is created to be orthogonal to the word lines to match the via plug 16. Next, the bit line 14 is formed by performing argon ion milling. Finally, a protection film is formed.

The storage device is formed as described above.

Example 2

A storage device is made using the manufacturing method described in the third embodiment. The manufacturing method according to the present embodiment will be described with reference to FIGS. 12A to 18A and 12B to 18B. In addition, Example 2 is the same as Example 1 except that lithography using self-assembly is applied in lithography, and a design rule is different.

A nitride film (first insulation layer 22) having the thickness of 50 nm is deposited on a silicon wafer using the chemical vapor deposition (CVD) method. Next, the self-organizing resist is patterned by lithography. Meanwhile, the block copolymer (PS-b-PMMA) of polystyrene (PS) and polymethylmethacrylate (PMMA) is used.

In addition, for example, Japanese Patent 3940546 discloses a patterning method using the block copolymer. Further, for example, U.S. Pat. No. 6,746,825 discloses a method of arranging block copolymers using a chemical guide.

The word lines 12 are formed according to the same method as in Example 1. The carbon film made by dissolving the novolac resin in PGMEA is used. The film is thermally cured by being spin-coated to have the thickness of 100 nm, then baked at 180° C. for 60 seconds on a hotplate and further baked 300° C. for 60 seconds on another hotplate.

Next, SOG (Spin on Glass) is vitrified by being spin-coated, baked at 200° C. for 60 seconds on the hotplate and then further baked at 300° C. for 60 seconds on another hotplate. The film thickness is 15 nm. This carbon film and SOG become the first patterning layer 30.

Next, 1H, 1H, 2H, 2H-Perfluorodecyltriethoxysilane is coated as the first polymer 40. Exposure is performed at the width of about 30 nm at the pitch of 96 nm using the ArF exposure equipment (FIGS. 12A and 12B).

Next, a resist dissolved in a resist solution (Propylene glycol monomethyl ether acetate: PGMEA) of PS-b-PMMA is spin-coated as the second polymer 42. Then, the PS and PMMA stripe structures having the line-and-space of 24 nm are made (FIGS. 13A and 13B).

This PMMA is removed by RIE, and the lower oxide film and carbon film are sequentially etched by RIE to resolve the line-and-space pattern of 24 nm (FIGS. 14A, 14B, 15A and 15B).

Using this pattern as a mask, the nitride film (first insulation layer 22) is etched by the RIE method and processed in the line-and-space pattern. Next, gold is deposited by the deposition method. Extra gold is removed using CMP and is simultaneously planarized. The gold wirings of the line-and-space pattern of 24 nm fabricated in this way function as the word lines 12.

Next, an oxide film (second insulation layer 24) of 2 nm is formed according to an atomic layer deposition (ALD) method. Further, the second patterning layer 32 is formed.

Next, 1H, 1H, 2H, 2H-Perfluorodecyltriethoxysilane is coated as the first polymer 40. Further, the space portion is exposed as in FIG. 16 by ArF lithography.

Next, a resist made by dissolving PS-b-PMMA in PGMEA is spin-coated as the second polymer 42 which can make a dot pattern of the pitch of 55 nm. Then, the pattern for the via plug of a houndstooth check pattern as in FIG. 17A is formed. Further, a hole pattern having the diameter of 30 nm illustrated in FIG. 18B is fabricated to match a space portion of the word lines 12 by transferring the pattern to the second patterning layer 32.

Molybdenum is deposited by sputtering, and extra molybdenum is removed by CMP. Further, for example, the resist is removed by oxygen ashing and the via plug 16 made of molybdenum is made. Next, the oxide film (second insulation layer 24) deposited by ALD using diluted hydrofluoric acid is scraped, and the oxide film (second insulation layer 24) of several nm between the via plug 16 and the word lines 12 is also removed from the edge.

Next, the oxide film is immersed in a toluene solution in which SAM molecules are dissolved, and thiol groups of the SAM molecules are adsorbed to the gold wirings. In this case, the thiol groups of the SAM molecules selectively adsorbed to gold of the word lines 12 without adsorbing to the molybdenum side. Next, SOG is coated and planarized.

Molybdenum is deposited by sputtering again. Next, using ArF lithography, the line-and-space pattern of 28 nm is created to be orthogonal to the word lines 12 to match the via plug 16. Next, the bit line 14 is formed by performing argon ion milling. Finally, a protection film is formed.

The storage device is formed as described above.

While certain embodiments have been described, these embodiments have been presented by way of example only, and are not intended to limit the scope of the inventions. Indeed, the storage device and method of manufacturing the storage device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

Although, in the embodiments, only resistance change type molecular chains are mentioned as organic molecules which form organic molecular layers, this does not exclude that other organic molecules are included in organic molecular layers in addition to resistance change type molecular chains.

What is claimed is:

1. A storage device comprising:
   a plurality of A-wirings;
   a plurality of B-wirings crossing the A-wirings;
   a first via plug formed between a first B-wiring and two adjacent A-wirings consisting of a first A-wiring and a second A-wiring, a maximum diameter of the first via plug at a bottom surface, which is facing the A-wirings in a direction vertical to an extending direction of the A-wirings, is smaller than a length corresponding to a pitch of the A-wirings plus a width of the A-wirings;
   a first storage element formed between the first via plug and the first A-wiring;
   a second storage element formed between the first via plug and the second A-wiring;
   a second via plug formed between a second B-wiring adjacent to the first B-wiring and two adjacent A-wirings consisting of the second A-wiring and a third A-wiring, a maximum diameter of the second via plug at a bottom surface, which is facing the A-wirings in a direction vertical to the extending direction of the A-wirings, is smaller than the length corresponding to the pitch of the A-wirings plus the width of the A-wirings;
   a third storage element formed between the second via plug and the second A-wiring; and
   a fourth storage element formed between the second via plug and the third A-wiring.

2. The device according to claim 1, wherein the first, second, third and fourth storage elements are organic molecular layers comprising resistance change type molecular chains.

3. The device according to claim 2, wherein a distance between the A wirings and the first and second via plugs is 0.5 nm or more and 5.0 nm or less.

4. The device according to claim 2, wherein, one ends of the resistance change type molecular chains are thiol groups, one of a first material forming the A-wirings and a second material forming the first and second via plugs is gold (Au), silver (Ag), copper (Cu), tungsten (W), tungsten nitride ($WN_2$), tantalum nitride (TaN) or titanium nitride (TiN), and the other of the first material and the second material is tantalum (Ta), molybdenum (Mo), molybdenum nitride (MoN) or silicon (Si).

5. The device according to claim 2, wherein, one ends of the resistance change type molecular chains are alcohol groups or carboxyl groups, one of a first material forming the A-wirings and a second material forming the first and second via plugs is tungsten (W), tungsten nitride ($WN_2$), tantalum (Ta), tantalum nitride (TaN), molybdenum (Mo), molybdenum nitride (MoN) or titanium nitride (TiN), and the other of the first material and the second material is gold (Au), silver (Ag), copper (Cu) or silicon (Si).

6. The device according to claim 2, wherein, one ends of the resistance change type molecular chains are silanol groups, one of a first material forming the A-wirings and a second material forming the first and second via plugs is silicon (Si) or a metal oxide, and the other of the first material and the second material is gold (Au), silver (Ag), copper (Cu), tungsten (W), tungsten nitride ($WN_2$), tantalum (Ta), tantalum nitride (TaN), molybdenum (Mo), molybdenum nitride (MoN) or titanium nitride (TiN).

7. The device according to claim 2, wherein one ends of the resistance change type molecular chains chemically bind to the A-wirings and the other ends of the resistance change type molecular chains do not chemically bind to the first and second via plugs, or one ends of the resistance change type molecular chains do not chemically bind to the A-wirings and the other ends of the resistance change type molecular chains chemically bind to the first and second via plugs.

8. The device according to claim 2, wherein the resistance change type molecular chains comprise molecules having a π conjugated system stretched in a one dimensional direction, and the π conjugated system has 5 or more and 20 or less units of —CH═CH— in a one dimensional direction.

9. The device according to claim 2, wherein the resistance change type molecular chains comprise 4-[2-amino-5-nitro-4-(phenyl-ethynyl)phenylethynyl]benzenethiol.

10. The device according to claim 2, wherein the A-wirings are tungsten (W) and the first and second via plug are molybdenum (Mo).

11. The device according to claim 2, wherein the resistance change type molecular chains have diode characteristics.

12. A storage device comprising:
    a plurality of first wirings;
    a plurality of second wirings crossing the first wirings; and
    a plurality of via plugs formed between the first wirings and the second wirings,
    wherein each of the via plugs is formed between a second wiring and two adjacent first wirings, a maximum diameter of each of the via plugs at a bottom surface, which is facing the first wirings in a direction vertical to an extending direction of the first wirings, is smaller than a length corresponding to a pitch of the first wirings plus a width of the first wirings,
    a first storage element is formed between each of the via plugs and one of the two adjacent first wirings,
    a second storage element is formed between each of the via plugs and the other one of the two adjacent first wirings, and
    the via plugs are arranged in a houndstooth check pattern.

13. The device according to claim 12, wherein the first and second storage elements are organic molecular layers comprising resistance change type molecular chains.

14. The device according to claim 13, wherein a distance between the first wirings and the via plugs is 0.5 nm or more and 5.0 nm or less.

15. The device according to claim 13, wherein one ends of the resistance change type molecular chains are thiol groups, one of a first material forming the first wirings and a second material forming the via plugs is gold (Au), silver (Ag), copper (Cu), tungsten (W), tungsten nitride ($WN_2$), tantalum nitride (TaN) or titanium nitride (TiN), and the other of the first material and the second material is tantalum (Ta), molybdenum (Mo), molybdenum nitride (MoN) or silicon (Si).

16. The device according to claim 13, wherein one ends of the resistance change type molecular chains are alcohol groups or carboxyl groups, one of a first material forming the first wiring and a second material forming the via plugs is tungsten (W), tungsten nitride ($WN_2$), tantalum (Ta), tantalum nitride (TaN), molybdenum (Mo), molybdenum nitride (MoN) or titanium nitride (TiN), and the other of the first material and the second material is gold (Au), silver (Ag), copper (Cu) or silicon (Si).

17. The device according to claim 13, wherein one ends of the resistance change type molecular chains are silanol groups, one of a first material forming the first wirings and the via plugs is silicon (Si) or a metal oxide, and the other of the first material and the second material is gold (Au), silver (Ag), copper (Cu), tungsten (W), tungsten nitride ($WN_2$), tantalum (Ta), tantalum nitride (TaN), molybdenum (Mo), molybdenum nitride (MoN) or titanium nitride (TiN).

18. The device according to claim 13, wherein one ends of the resistance change type molecular chains chemically bind to the first wirings and the other ends of the resistance change type molecular chains do not chemically bind to the via plugs, or one ends of the resistance change type molecular chains do not chemically bind to the first wirings and the other ends of the resistance change type molecular chains chemically bind to the via plugs.

19. The device according to claim 13, wherein the resistance change type molecular chains comprise molecules having a π conjugated system stretched in a one dimensional direction, and the p conjugated system has 5 or more and 20 or less units of —CH═CH— in a one dimensional direction.

* * * * *